(12) United States Patent
Weightman et al.

(10) Patent No.: US 12,402,219 B2
(45) Date of Patent: Aug. 26, 2025

(54) MULTIPLE LOCATION LOAD CONTROL SYSTEM

(71) Applicant: Lutron Technology Company LLC, Coopersburg, PA (US)

(72) Inventors: Russell Weightman, Abington, PA (US); Jonathan T. Lenz, Waltham, MA (US); Jaykrishna A. Shukla, Mays Landing, NJ (US); Daniel Curtis Raneri, Orefield, PA (US)

(73) Assignee: Lutron Technology Company LLC, Coopersburg, PA (US)

( * ) Notice: Subject to any disclaimer, the term of this patent is extended or adjusted under 35 U.S.C. 154(b) by 0 days.

(21) Appl. No.: 18/659,170

(22) Filed: May 9, 2024

(65) Prior Publication Data

US 2024/0292502 A1 Aug. 29, 2024

Related U.S. Application Data

(63) Continuation of application No. 18/154,907, filed on Jan. 16, 2023, now Pat. No. 12,016,094, which is a
(Continued)

(51) Int. Cl.
*H05B 39/08* (2006.01)
*G11C 5/00* (2006.01)
(Continued)

(52) U.S. Cl.
CPC ............ *H05B 39/086* (2013.01); *G11C 5/005* (2013.01); *G11C 5/025* (2013.01); *G11C 7/04* (2013.01);
(Continued)

(58) Field of Classification Search
CPC .... H05B 39/08; H05B 39/086; H05B 47/185; H05B 47/17; H05B 47/10; H05B 47/165;
(Continued)

(56) References Cited

U.S. PATENT DOCUMENTS 4,429,299 A 1/1984 Kabat et al.
4,815,106 A 3/1989 Propp et al.
(Continued)

OTHER PUBLICATIONS

Yin, et al., "A study of tri-state modulation in power line carrier communication system.", Automation & Instrumentation 6 (2009), pp. 16-19.

*Primary Examiner* — Robert L Deberadinis
(74) *Attorney, Agent, or Firm* — Michael S. Czarnecki; Glen R. Farbanish; Philip N. Smith

(57) ABSTRACT

A load control device may include a semiconductor switch, a control circuit, and first and second terminals adapted to be coupled to a remote device. The load control device may include a first switching circuit coupled to the second terminal, and a second switching circuit coupled between the first terminal and the second terminal. The control circuit may be configured to render the first switching circuit conductive to conduct a charging current from an AC power source to a power supply of the remote device during a first time period of a half-cycle of the AC power source, and further configured to render the first and second switching circuits conductive and non-conductive to communicate with the remote device via the second terminal during a second time period of the half-cycle of the AC power source.

18 Claims, 21 Drawing Sheets

Related U.S. Application Data continuation of application No. 17/402,809, filed on Aug. 16, 2021, now Pat. No. 11,558,939, which is a continuation of application No. 16/811,226, filed on Mar. 6, 2020, now Pat. No. 11,094,353, which is a continuation of application No. 16/179,317, filed on Nov. 2, 2018, now Pat. No. 10,593,373, which is a continuation of application No. 15/611,882, filed on Jun. 2, 2017, now Pat. No. 10,129,948, which is a continuation of application No. 14/720,701, filed on May 22, 2015, now Pat. No. 9,699,863.

(60) Provisional application No. 62/005,922, filed on May 30, 2014.

(51) Int. Cl.
| | | |
|---|---|---|
| *G11C 5/02* | (2006.01) | |
| *G11C 7/04* | (2006.01) | |
| *G11C 7/24* | (2006.01) | |
| *G11C 11/406* | (2006.01) | |
| *G11C 29/12* | (2006.01) | |
| *H05B 39/04* | (2006.01) | |
| *H05B 47/10* | (2020.01) | |
| *H05B 47/165* | (2020.01) | |
| *H05B 47/17* | (2020.01) | |
| *H05B 47/185* | (2020.01) | |

(52) U.S. Cl.
CPC .......... *G11C 7/24* (2013.01); *G11C 11/40626* (2013.01); *G11C 29/12* (2013.01); *H05B 39/04* (2013.01); *H05B 47/10* (2020.01); *H05B 47/165* (2020.01); *H05B 47/17* (2020.01); *H05B 47/185* (2020.01)

(58) Field of Classification Search
CPC ........... G11C 5/00; G11C 5/005; G11C 5/025; G11C 7/04; G11C 7/24; G11C 11/40626; G11C 29/12; G11C 11/406; G11C 5/02
See application file for complete search history.

(56) References Cited

U.S. PATENT DOCUMENTS

| | | |
|---|---|---|
| 5,248,919 A | 9/1993 | Hanna et al. |
| 5,798,581 A | 8/1998 | Keagy et al. |
| 5,905,442 A | 5/1999 | Mosebrook et al. |
| 6,351,489 B1 | 2/2002 | Tetzlaff et al. |
| 6,980,122 B2 | 12/2005 | Novikov et al. |
| 6,987,449 B2 | 1/2006 | Novikov et al. |
| 7,012,518 B2 | 3/2006 | Novikov et al. |
| 7,180,886 B2 | 2/2007 | Liu et al. |
| 7,183,900 B2 | 2/2007 | Sullivan et al. |
| 7,186,003 B2 | 3/2007 | Dowling et al. |
| 7,190,125 B2 | 3/2007 | McDonough et al. |
| 7,247,999 B2 | 7/2007 | Kumar |
| 7,385,422 B2 | 6/2008 | Lin et al. |
| 7,519,005 B2 | 4/2009 | Hejdeman et al. |
| 7,608,948 B2 | 10/2009 | Nearhoof et al. |
| 7,687,940 B2 | 3/2010 | Mosebrook et al. |
| 7,723,925 B2 | 5/2010 | Mosebrook et al. |
| 7,772,724 B2 | 8/2010 | Mosebrook et al. |
| 7,791,595 B2 | 9/2010 | Altonen et al. |
| 7,847,440 B2 | 12/2010 | Mosebrook et al. |
| 7,855,543 B2 | 12/2010 | Newman, Jr. et al. |
| 7,863,933 B2 | 1/2011 | Chuang et al. |
| 7,872,429 B2 | 1/2011 | Steiner et al. |
| 8,009,743 B2 | 8/2011 | Hall et al. |
| 8,068,014 B2 | 11/2011 | Steiner et al. |
| 8,143,806 B2 | 3/2012 | Mosebrook et al. |
| 8,212,424 B2 | 7/2012 | Mosebrook et al. |
| 8,212,425 B2 | 7/2012 | Mosebrook et al. |
| 8,242,708 B2 | 8/2012 | Buck et al. |
| 8,471,687 B2 | 6/2013 | Steiner et al. |
| 8,638,199 B2 | 1/2014 | Burton et al. |
| 8,639,193 B2 | 1/2014 | Lee et al. |
| 8,810,154 B2 | 8/2014 | Buck et al. |
| 2004/0206616 A1 | 10/2004 | Leopold et al. |
| 2005/0063363 A1 | 3/2005 | Lazar et al. |
| 2012/0144078 A1 | 6/2012 | Poulsen et al. |
| 2013/0169316 A1 | 7/2013 | Lee et al. |
| 2013/0181630 A1 | 7/2013 | Taipale et al. |
| 2014/0265880 A1 | 9/2014 | Taipale et al. |

MULTIPLE LOCATION LOAD CONTROL SYSTEM

CROSS-REFERENCE TO RELATED APPLICATIONS

This application is a continuation of U.S. patent application Ser. No. 18/154,907, filed Jan. 16, 2023; which is a continuation of U.S. patent application Ser. No. 17/402,809, filed Aug. 16, 2021, now U.S. Pat. No. 11,558,939, issued Jan. 17, 2023; which is a continuation of U.S. patent application Ser. No. 16/811,226, filed Mar. 6, 2020, now U.S. Pat. No. 11,094,353, issued Aug. 17, 2021; which is a continuation of U.S. patent application Ser. No. 16/179,317, filed Nov. 2, 2018, now U.S. Pat. No. 10,593,373 issued Mar. 17, 2020; which is a continuation of U.S. patent application Ser. No. 15/611,882, filed Jun. 2, 2017, now U.S. Pat. No. 10,129,948, issued on Nov. 13, 2018; which is a continuation of U.S. patent application Ser. No. 14/720,701, filed May 22, 2015, now U.S. Pat. No. 9,699,863, issued on Jul. 4, 2017; which claims the benefit of U.S. Provisional Application No. 62/005,922, filed May 30, 2014, the entire contents of which are incorporated by reference herein.

BACKGROUND

Three-way and four-way switch systems for use in controlling electrical loads, such as lighting loads, are known in the art. Typically, the switches are coupled together in series electrical connection between an alternating-current (AC) power source and the lighting load. The switches are subjected to an AC source voltage and carry full load current between the AC power source and the lighting load, as opposed to low-voltage switch systems that operate at low voltage and low current, and communicate digital commands (usually low-voltage logic levels) to a remote controller that controls the level of AC power delivered to the load in response to the commands. Thus, as used herein, the terms "three-way switch", "three-way system", "four-way switch", and "four-way system" mean such switches and systems that are subjected to the AC source voltage and carry the full load current.

A three-way switch derives its name from the fact that it has three terminals and is more commonly known as a single-pole double-throw (SPDT) switch, but will be referred to herein as a "three-way switch". Note that in some countries a three-way switch as described above is known as a "two-way switch".

A four-way switch is a double-pole double-throw (DPDT) switch that is wired internally for polarity-reversal applications. A four-way switch is commonly called an intermediate switch, but will be referred to herein as a "four-way switch".

In a typical, prior art three-way switch system, two three-way switches control a single lighting load, and each switch is fully operable to independently control the load, irrespective of the status of the other switch. In such a three-way switch system, one three-way switch must be wired at the AC power source side of the system (sometimes called "line side"), and the other three-way switch must be wired at the lighting load side of the system.

FIG. 1A shows a standard three-way switch system 100, which includes two three-way switches 102, 104. The switches 102, 104 are connected between an AC power source 106 and a lighting load 108. The three-way switches 102, 104 each include "movable" (or common) contacts, which are electrically connected to the AC power source 106 and the lighting load 108, respectively. The three-way switches 102, 104 also each include two fixed contacts. When the movable contacts are making contact with the upper fixed contacts, the three-way switches 102, 104 are in position A in FIG. 1A. When the movable contacts are making contact with the lower fixed contact, the three-way switches 102, 104 are in position B. When the three-way switches 102, 104 are both in position A (or both in position B), the circuit of system 100 is complete and the lighting load 108 is energized. When switch 102 is in position A and switch 104 is in position B (or vice versa), the circuit is not complete and the lighting load 108 is not energized.

Three-way dimmer switches that replace three-way switches are known in the art. An example of a three-way dimmer switch system 150, including one prior art three-way dimmer switch 152 and one three-way switch 104 is shown in FIG. 1B. The three-way dimmer switch 152 includes a dimmer circuit 152A and a three-way switch 152B. A typical, AC phase-control dimmer circuit 152A regulates the amount of energy supplied to the lighting load 108 by conducting for some portion of each half-cycle of the AC waveform, and not conducting for the remainder of the half-cycle. Because the dimmer circuit 152A is in series with the lighting load 108, the longer the dimmer circuit conducts, the more energy will be delivered to the lighting load 108. Where the lighting load 108 is a lamp, the more energy that is delivered to the lighting load 108, the greater the light intensity level of the lamp. In a typical dimming operation, a user may adjust a control to set the light intensity level of the lamp to a desired light intensity level. The portion of each half-cycle for which the dimmer conducts is based on the selected light intensity level. The user is able to dim and toggle the lighting load 108 from the three-way dimmer switch 152 and is only able to toggle the lighting load from the three-way switch 104. Since two dimmer circuits cannot be wired in series, the three-way dimmer switch system 150 can only include one three-way dimmer switch 152, which can be located on either the line side or the load side of the system.

A four-way switch system is required when there are more than two switch locations from which to control the load. For example, a four-way system requires two three-way switches and one four-way switch, wired in well known fashion, so as to render each switch fully operable to independently control the load irrespective of the status of any other switches in the system. In the four-way system, the four-way switch is required to be wired between the two three-way switches in order for all switches to operate independently, i.e., one three-way switch must be wired at the AC source side of the system, the other three-way switch must be wired at the load side of the system, and the four-way switch must be electrically situated between the two three-way switches.

FIG. 1C shows a prior art four-way switching system 180. The system 180 includes two three-way switches 102, 104 and a four-way switch 185. The four-way switch 185 has two states. In the first state, node A1 is connected to node A2 and node B1 is connected to node B2. When the four-way switch 185 is toggled, the switch changes to the second state in which the paths are now crossed (i.e., node A1 is connected to node B2 and node B1 is connected to node A2). Note that a four-way switch can function as a three-way switch if one terminal is simply not connected.

FIG. 1D shows another prior art switching system 190 containing a plurality of four-way switches 185. As shown, any number of four-way switches can be included between the three-way switches 102, 104 to enable multiple location control of the lighting load 108.

Multiple location dimming systems employing a smart dimmer and one or more specially-designed remote (or "accessory") dimmers have been developed. The remote dimmers permit the intensity level of the lighting load to be adjusted from multiple locations. A smart dimmer is one that includes a microcontroller or other processing means for providing an advanced set of control features and feedback options to the end user. For example, the advanced features of a smart dimmer may include a protected or locked lighting preset, fading, and double-tap to full intensity. The microcontroller controls the operation of the semiconductor switch to thus control the intensity of the lighting load.

To power the microcontroller, the smart dimmers include power supplies, which draw a small amount of current through the lighting load when the semiconductor switch is non-conductive each half-cycle. The power supply typically uses this small amount of current to charge a storage capacitor and develop a direct-current (DC) voltage to power the microcontroller. An example of a multiple location lighting control system, including a wall-mountable smart dimmer switch and wall-mountable remote switches for wiring at all locations of a multiple location dimming system, is disclosed in commonly assigned U.S. Pat. No. 5,248,919, issued on Sep. 28, 1993, entitled LIGHTING CONTROL DEVICE, which is herein incorporated by reference in its entirety.

Referring again to the system 150 of FIG. 1B, since no load current flows through the dimmer circuit 152A of the three-way dimmer switch 152 when the circuit between the AC power source 106 and the lighting load 108 is broken by either three-way switch 152B or 104, the dimmer switch 152 is not able to include a power supply and a microcontroller. Thus, the dimmer switch 152 is not able to provide the advanced set of features of a smart dimmer to the end user.

FIG. 2 shows an example multiple location lighting control system 200 including one wall-mountable smart dimmer 202 and one wall-mountable remote dimmer 204. The dimmer 202 has a hot (H) terminal for receipt of an AC source voltage provided by an AC power source 206, and a dimmed-hot (DH) terminal for providing a dimmed-hot (or phase-controlled) voltage to a lighting load 208. The remote dimmer 204 is connected in series with the DH terminal of the dimmer 202 and the lighting load 208, and passes the dimmed-hot voltage through to the lighting load 208.

The dimmer 202 and the remote dimmer 204 both have actuators to allow for raising, lowering, and toggling on/off the light intensity level of the lighting load 208. The dimmer 202 is responsive to actuation of any of these actuators to alter the intensity level or to power the lighting load 208 on/off accordingly. In particular, an actuation of an actuator at the remote dimmer 204 causes an AC control signal, or partially rectified AC control signal, to be communicated from that remote dimmer 204 to the dimmer 202 over the wiring between the accessory dimmer (AD) terminal (i.e., accessory terminal) of the remote dimmer 204 and the AD terminal of the dimmer 202. The dimmer 202 is responsive to receipt of the control signal to alter the dimming level or toggle the load 208 on/off. Thus, the load can be fully controlled from the remote dimmer 204.

The user interface of the dimmer 202 of the multiple location lighting control system 200 is shown in FIG. 3. As shown, the dimmer 202 may include a faceplate 310, a bezel 312, an intensity selection actuator 314 for selecting a desired level of light intensity of a lighting load 208 controlled by the dimmer 202, and a control switch actuator 316. An actuation of the upper portion 314A of the actuator 314 increases or raises the light intensity of the lighting load 208, while an actuation of the lower portion 314B of the actuator 314 decreases or lowers the light intensity.

The dimmer 202 may also include a visual display in the form of a plurality of light sources 318, such as light-emitting diodes (LEDs). The light sources 318 may be arranged in an array (such as a linear array as shown), and are illuminated to represent a range of light intensity levels of the lighting load 208 being controlled. The intensity levels of the lighting load 208 may range from a minimum intensity level, which may be the lowest visible intensity, but which may be "full off", or 0%, to a maximum intensity level, which is typically "full on", or substantially 100%. Light intensity level is typically expressed as a percent of full intensity. Thus, when the lighting load 208 is on, light intensity level may range from 1% to substantially 100%.

FIG. 4 is a simplified block diagram of the dimmer 202 and the remote dimmer 204 of the multiple location lighting control system 200. The dimmer 202 includes a bidirectional semiconductor switch 420, e.g., a triac or two field-effect transistors (FETs) in anti-series connection, coupled between the hot terminal H and the dimmed-hot terminal DH, to control the current through, and thus the light intensity of, the lighting load 208. The semiconductor switch 420 has a control input (or gate), which is connected to a gate drive circuit 424. The input to the gate renders the semiconductor switch 420 conductive or non-conductive, which in turn controls the power supplied to the lighting load 208. The gate drive circuit 424 provides control inputs to the semiconductor switch 420 in response to command signals from a microcontroller 426.

The microcontroller 426 receives inputs from a zero-crossing detector 430 and a signal detector 432 and controls the semiconductor switch 420 accordingly. The microcontroller 426 also generates command signals to a plurality of LEDs 418 for providing feedback to the user of the dimmer 202. A power supply 428 generates a DC output voltage Vcc to power the microcontroller 426. The power supply is coupled between the hot terminal H and the dimmed hot terminal DH.

The zero-crossing detector 430 determines the zero-crossings of the input AC supply voltage from the AC power supply 206. A zero-crossing is defined as the time at which the AC supply voltage transitions from positive to negative polarity (i.e., a negative-going zero-crossing), or from negative to positive polarity (i.e., a positive-going zero-crossing), at the beginning of each half-cycle. The zero-crossing information is provided as an input to microcontroller 426. The microcontroller 426 provides the gate control signals to operate the semiconductor switch 420 to provide voltage from the AC power source 206 to the lighting load 208 at predetermined times relative to the zero-crossing points of the AC waveform.

Generally, two techniques are used for controlling the power supplied to the lighting load 208: forward phase control dimming and reverse phase control dimming. In forward phase control dimming, the semiconductor switch 420 is turned on at some point within each AC line voltage half-cycle and remains on until the next voltage zero-crossing. Forward phase control dimming is often used to control energy to a resistive or inductive load, which may include, for example, a magnetic low-voltage transformer or an incandescent lamp. In reverse phase control dimming, the semiconductor switch 420 is turned on at the zero-crossing of the AC line voltage and turned off at some point within each half-cycle of the AC line voltage. Reverse phase control is often used to control energy to a capacitive load, which may include, for example, an electronic low-voltage transformer. Since the semiconductor switch 420 must be conductive at the beginning of the half-cycle, and be able to be turned off with in the half-cycle, reverse phase control dimming requires that the dimmer have two FETs in anti-serial connection, or the like.

The signal detector 432 has an input 440 for receiving switch closure signals from momentary switches T, R, and L. Switch T corresponds to a toggle switch controlled by the switch actuator 316, and switches R and L correspond to the raise and lower switches controlled by the upper portion 314A and the lower portion 314B, respectively, of the intensity selection actuator 314.

Closure of switch T connects the input of the signal detector 432 to the DH terminal of the dimmer 202, and allows both positive and negative half-cycles of the AC current to flow through the signal detector. Closure of switches R and L also connects the input of the signal detector 432 to the DH terminal. However, when switch R is closed, current only flows through the signal detector 432 during the positive half-cycles of the AC power source 406 because of a diode 434. In similar manner, when switch L is closed, current only flows through the signal detector 432 during the negative half-cycles because of a diode 436. The signal detector 432 detects when the switches T, R, and L are closed, and provides two separate output signals representative of the state of the switches as inputs to the microcontroller 426. A signal on the first output of the signal detector 432 indicates a closure of switch R and a signal on the second output indicates a closure of switch L. Simultaneous signals on both outputs represents a closure of switch T. The microprocessor controller 426 determines the duration of closure in response to inputs from the signal detector 432.

The remote dimmer 204 provides a means for controlling the dimmer 202 from a remote location in a separate wall box. The remote dimmer 204 includes a further set of momentary switches T', R', and L' and diodes 434' and 436'. The wire connection is made between the AD terminal of the remote dimmer 204 and the AD terminal of the dimmer 202 to allow for the communication of actuator presses at the remote switch. The AD terminal is connected to the input 440 of the signal detector 432. The action of switches T', R', and L' in the remote dimmer 204 corresponds to the action of switches T, R, and L in the dimmer 202.

Since the remote dimmer 204 does not have LEDs, no feedback can be provided to a user at the remote dimmer 204. Therefore there is a need for multiple location dimming system in which the remote devices include visual displays for providing feedback to a user.

SUMMARY

A load control system may be provided for controlling an amount of power delivered to an electrical load from an AC power source. The load control system may include a load control device and a remote device. The load control device may be adapted to be coupled between the AC power source and the electrical load to control the amount of power delivered to the electrical load. The load control device may include a first terminal and a second terminal, a first switching circuit coupled to the second terminal, and a second switching circuit coupled between the first and second terminals. The remote device may be adapted to be coupled to the first terminal and the second terminal of the load control device. The remote device may include a power supply configured to conduct a charging current from the AC power source through the first switching circuit of the load control device.

The load control device may be configured to control the second terminal in an active pull-up state by rendering the first switching circuit conductive and the second switching circuit non-conductive. The load control device may be further configured to control the second terminal into an active pull-down state by rendering the second switching circuit conductive and the first switching circuit non-conductive. The load control device may be configured to render the first switching circuit conductive to allow the power supply of the remote device to charge through the second terminal during a first time period of a half cycle of the AC power source. Further, the load control device and the remote device may be operable to communicate with each other by controlling the second terminal into the active pull-up state and the active pull-down state during a second time period of the half-cycle of the AC power source.

A load control device may be used to controlling an amount of power delivered to an electrical load from an AC power source. The load control device may be adapted to be coupled to a remote device. The load control device may include a semiconductor switch configured to conduct a load current from the AC power source to the electrical load, a first terminal and a second terminal that are adapted to be coupled to the remote device, a first switching circuit, a second switching circuit, and a control circuit. The first switching circuit may be coupled to the second terminal, and may be configured to conduct a charging current from the AC power source to a power supply of the remote device. The second switching circuit may be coupled between the first terminal and the second terminal. The first terminal may be configured to be connected to the AC power source or the electrical load, and the second terminal may comprises (e.g., may be) an accessory terminal. The accessory terminal may be configured to be coupled to the remote device via accessory wiring.

The control circuit may be configured to control the semiconductor switch to control the power delivered to the electrical load. The control circuit may also be configured to render the first switching circuit conductive to conduct the charging current from the AC power source to the power supply of the remote device during a first time period of a half-cycle of the AC power source, and further configured to render the first and second switching circuits conductive and non-conductive to communicate with the remote device via the second terminal during a second time period of the half-cycle of the AC power source.

DETAILED DESCRIPTION

Figure 1A:
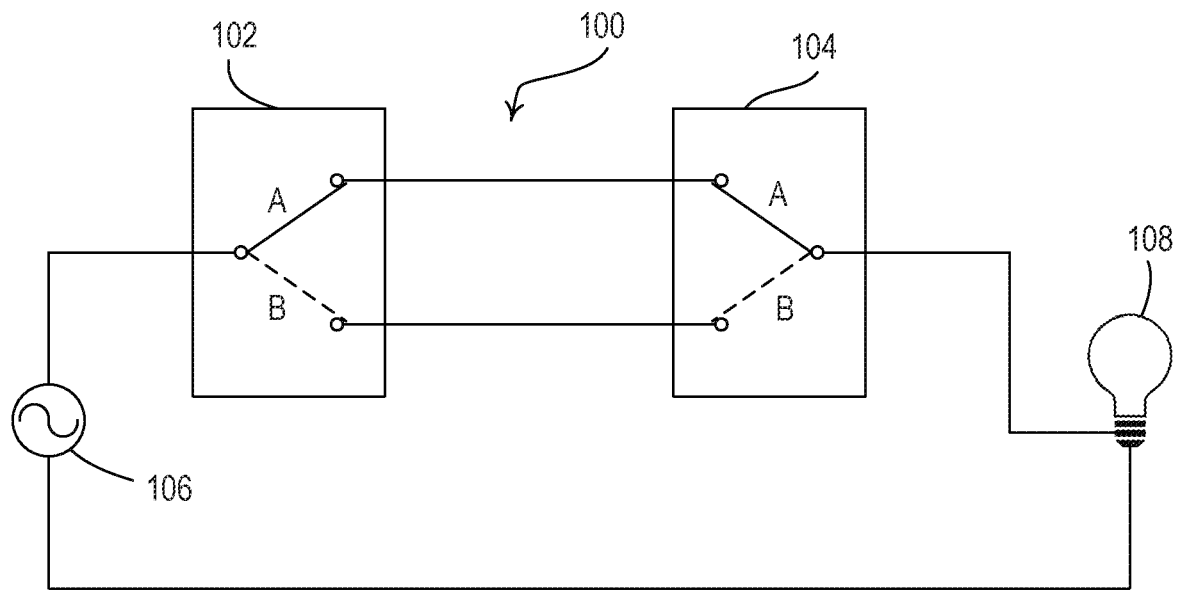
FIG. 1A is a diagram of an example of a prior art three-way switch system, which includes two three-way switches.
Figure 1B:
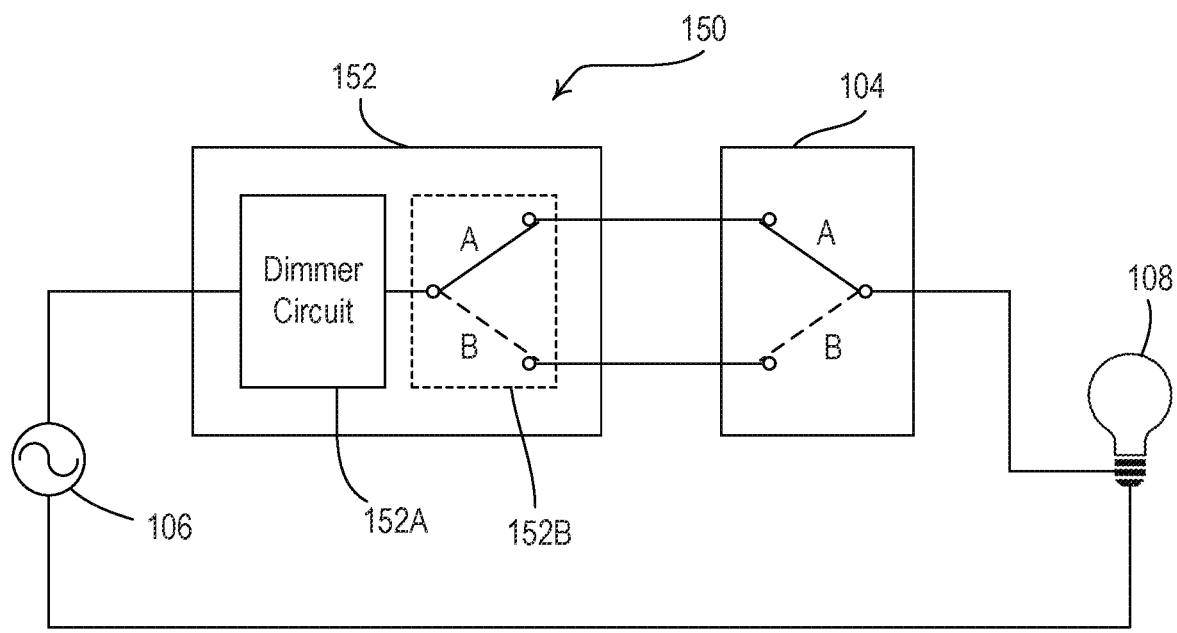
FIG. 1B is a diagram of an example of a prior art three-way dimmer switch system including one prior art three-way dimmer switch and one three-way switch.
Figure 1C:
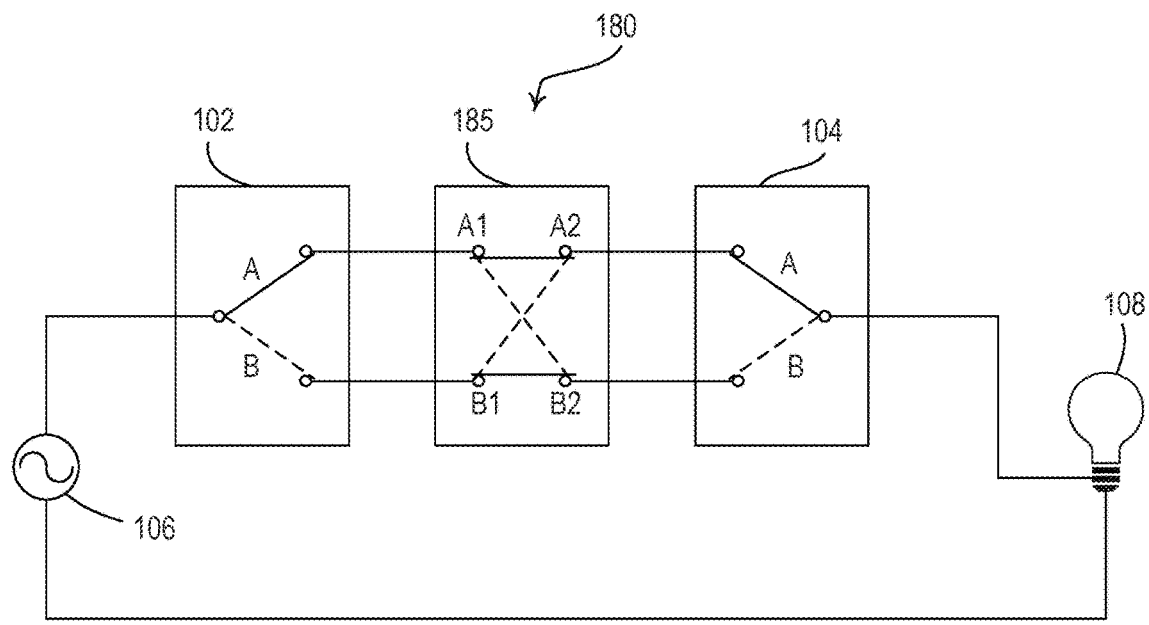
FIG. 1C is a diagram of an example of a prior art four-way switching system.
Figure 1D:
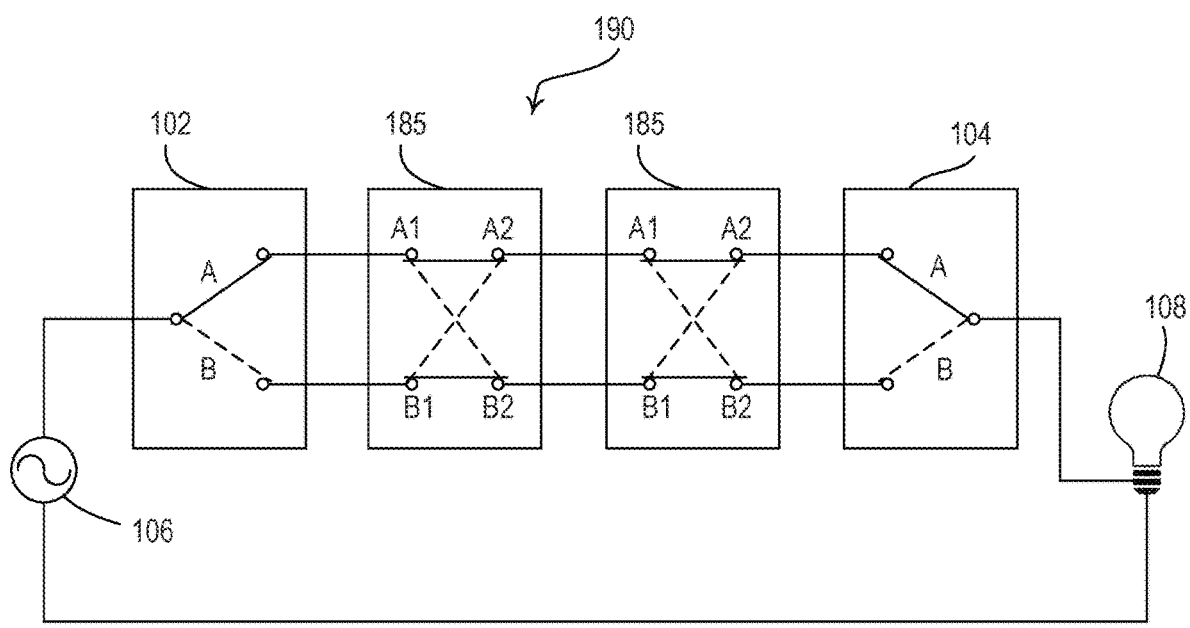
FIG. 1D is a diagram of an example of a prior art extended four-way switching system.
Figure 2:
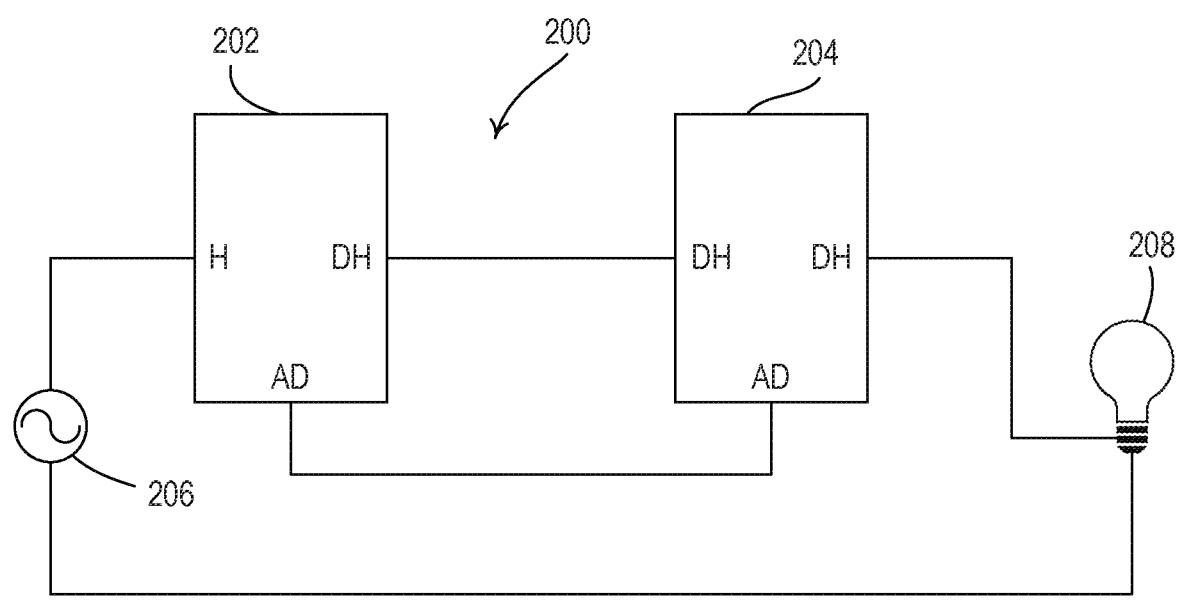
FIG. 2 is a diagram of an example of a prior art multiple location lighting control system having a dimmer switch and a remote switch.
Figure 3:
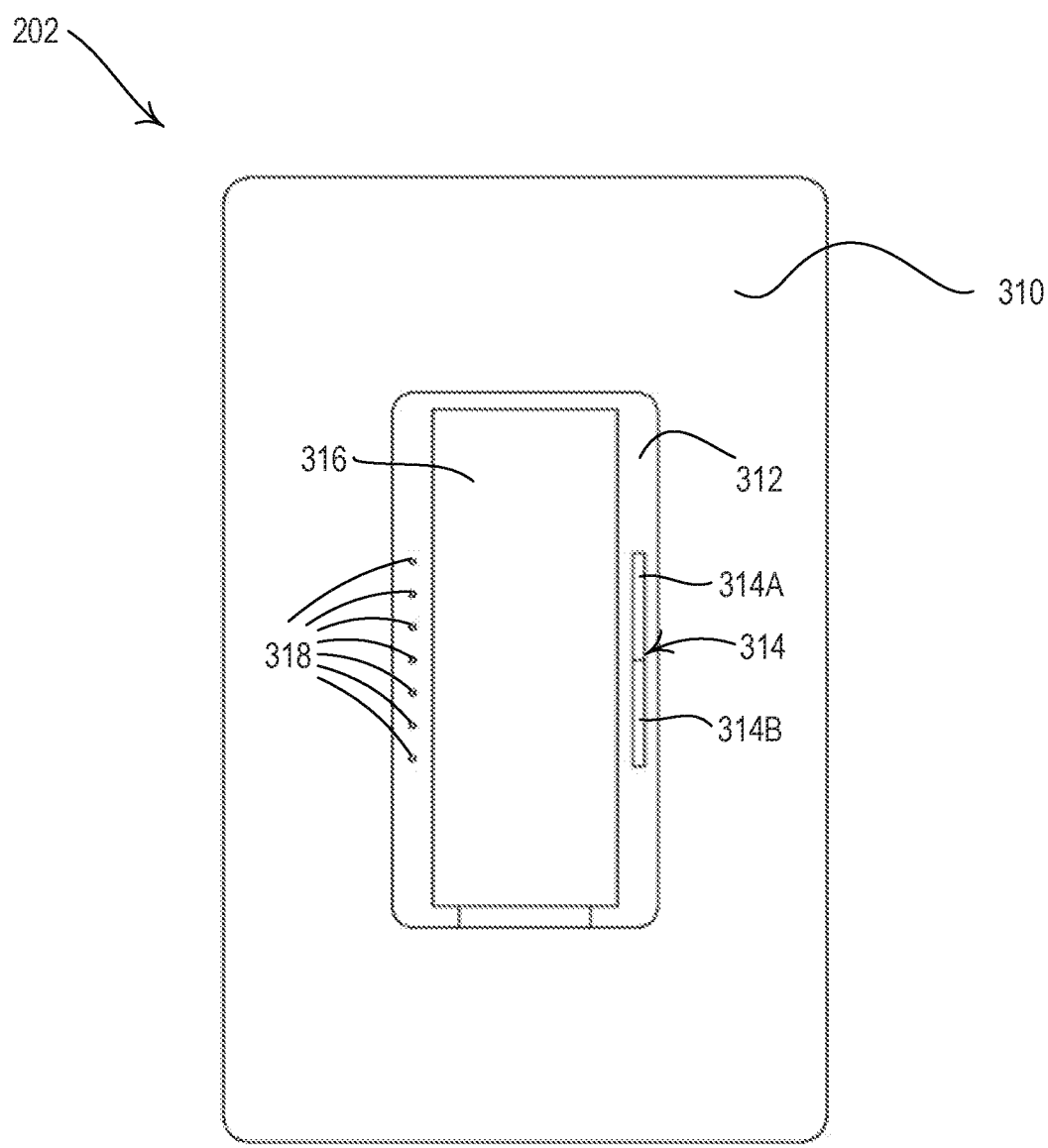
FIG. 3 is a front view of an example of a user interface of the dimmer switch of the multiple location lighting control system of FIG. 2.
Figure 4:
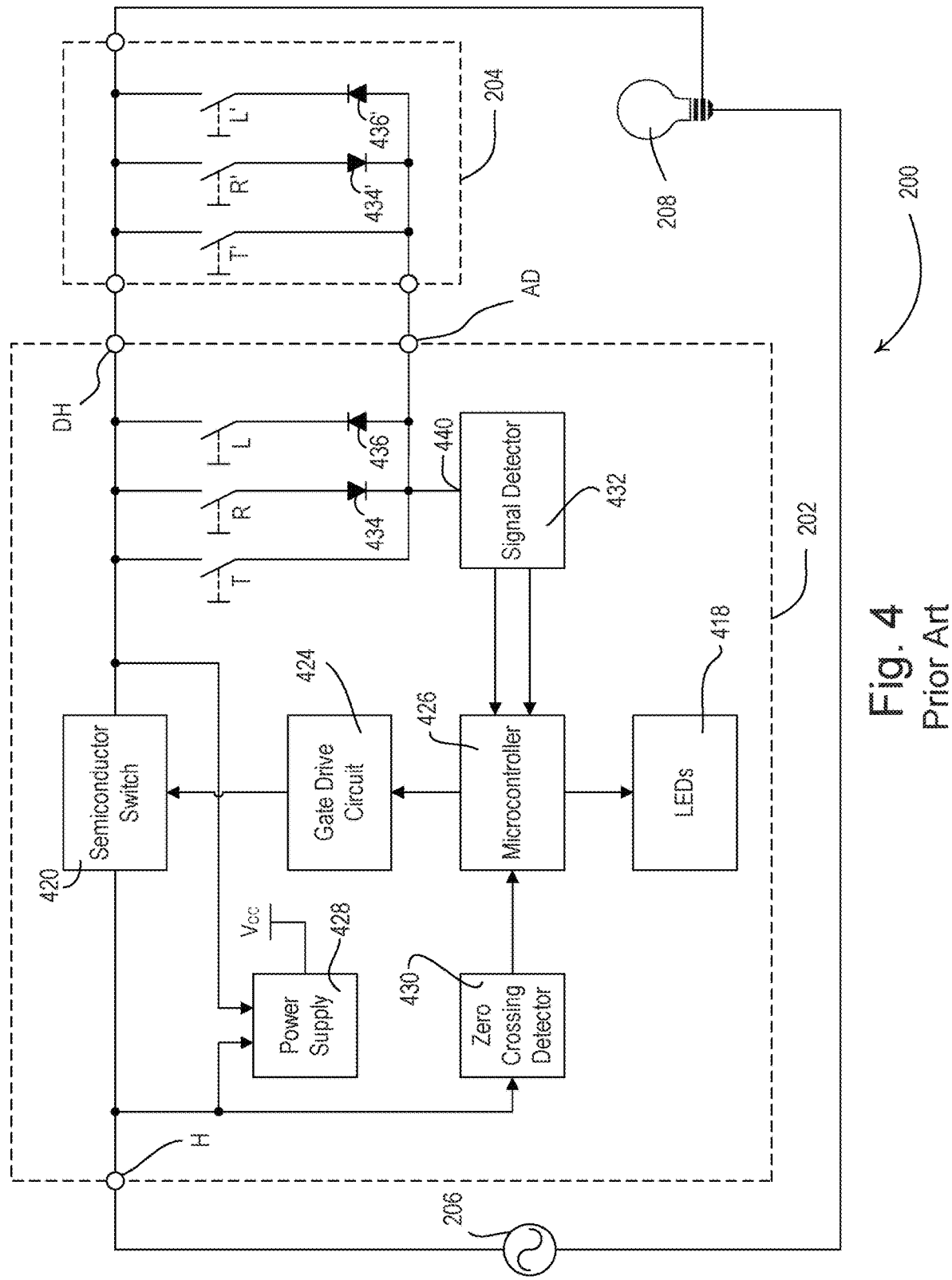
FIG. 4 is a diagram of an example of the dimmer switch and the remote switch of the multiple location lighting control system of FIG. 2.
Figure 5A:
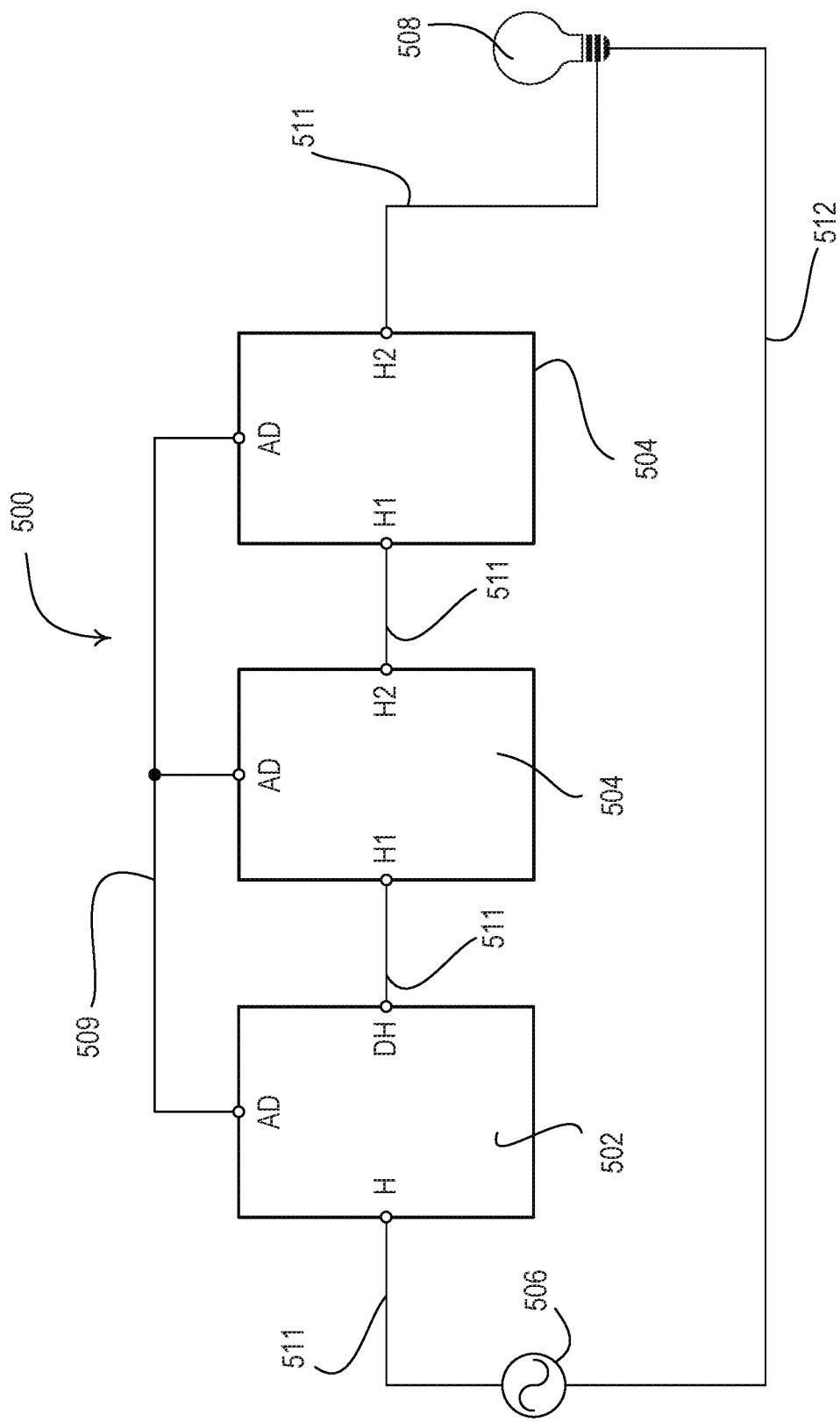
FIG. 5A is a block diagram of an example of a multiple location load control system.

FIG. 5A is a block diagram of an example of a multiple location load control system, e.g., a multiple location dimming system 500. The multiple location dimming system 500 may comprise a main load control device, e.g., a main dimmer 502, and one or more remote load control devices, e.g., two remote dimmers 504 (i.e., accessory dimmers). The main dimmer 502 and remote dimmers 504 may be coupled in series electrical connection between an AC power source 506 and a lighting load 508, for example, via a traveler wiring 511. The traveler wiring 511 may couple the AC power source 506 to the lighting load 508 via the main dimmer 502 and one or more remote dimmers 504, for example, to provide power to the lighting load 508. Neutral wiring 512 may couple the lighting load 508 back to the AC power source 506, for example, to provide a return path for any remaining power provided by the AC power source 506 and not dissipated by the lighting load 508.

The main dimmer 502 may be wired to the line side of the system 500 (e.g., as shown) or the load side of the system 500. Although the description herein is primarily with reference to the main dimmer 502 wired to the line side of the system 500, one or more embodiments may comprise the main dimmer 502 wired to the load side of the system 500 (e.g., and one or more remote dimmers 504 wired to the line side, accordingly). Further, any number of (e.g., more than two) remote dimmers 504 may be provided in the multiple location dimming system 500.

The main dimmer 502 may comprise a first main terminal and a second main terminal. For example, the main dimmer 502 may comprise a hot terminal H (i.e., a line-side load terminal) adapted to be coupled to the line-side of the system 500 and a dimmed-hot terminal DH (i.e., a load-side terminal) adapted to be coupled to the load-side of the system 500. The main dimmer 502 may comprise a load control circuit coupled between the hot and dimmed-hot terminals for controlling the amount of power delivered to the lighting load 508 (e.g., as described with reference to FIG. 7). The remote dimmers 504 may comprise a first main terminal and a second main terminal. For example, the remote dimmers 504 may comprise two hot terminals H1, H2, which may conduct the load current from the AC power source 506 to the lighting load 508. The main dimmer 502 and the remote dimmers 504 may each comprise an internal air-gap switch (e.g., air-gap switches 722, 822 shown in FIGS. 7 and 8A) for disconnecting the lighting load 508 from the AC power source 506. The main dimmer 502 and the remote dimmers 504 may each comprise an accessory dimmer (AD) terminal AD (i.e., accessory terminal) coupled together via a single accessory dimmer (AD) line 509 (i.e., an accessory wiring). The main dimmer 502 and the remote dimmers 504 may be operable to communicate, i.e., transmit and receive digital messages, via the AD line 509. The main dimmer 502 and the remote dimmers 504 may not include connections to the neutral side of the AC power source 506.

The main dimmer 502 and the remote dimmer 504 may include actuators and visual displays, such that lighting load 508 may be controlled from and feedback of the lighting load may be provided at each of the main dimmer 502 and the remote dimmers 504. In order to provide the visual displays at the remote dimmers 504, the remote dimmers 504 may include a control circuit (e.g., which may comprise a microprocessor) and a power supply for powering the microprocessor. The main dimmer 502 may provide an AD supply voltage VAD (e.g., approximately 80-170 VDC) on the AD line 509 to enable the power supplies of the remote dimmers 504 to charge during a first portion (i.e., a charging time $T_{CHRG}$) of a half-cycle of the AC power source 506. During a second portion (i.e., a communication time $T_{COMM}$) of the half-cycle, the main dimmer 502 and the remote dimmers 504 are operable to transmit and receive the digital messages via the AD line 509.

Figure 5B:
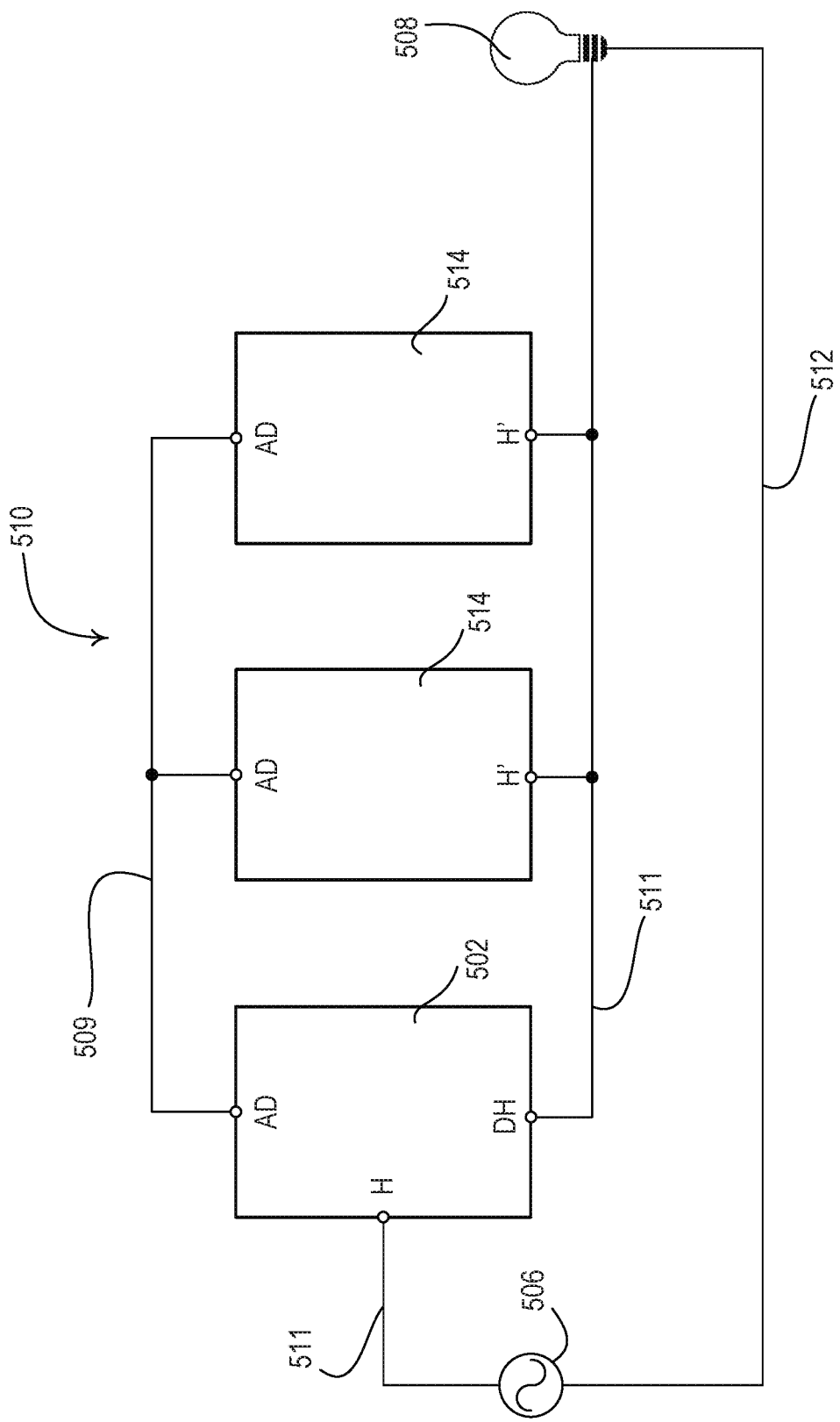
FIG. 5B is a block diagram of an example of a multiple location load control system.

FIG. 5B is a block diagram of an example of a multiple location load control system, e.g., a multiple location dimming system 510. The multiple location dimming system 510 may comprise a main load control device, e.g., a main dimmer 502, and one or more remote load control devices, e.g., two remote dimmers 514 (i.e., accessory dimmers). The remote dimmers 514 may be substantially similar to the remote dimmers 504, except the remote dimmers 514 may comprise a single main terminal (e.g., a single hot terminal H') as opposed to the first and second hot terminals H1 and H2 and may not comprise an air-gap switch (e.g., the air-gap switch 822 shown in FIG. 8A). One or more of the embodiments described herein with reference to the multiple location dimming system 500 and/or the remote dimmers 504 may be applicable to the multiple location dimming system 510 and/or the remote dimmers 514.

The main dimmer 502 may be coupled in series electrical connection between the AC power source 506 and the lighting load 508, for example, via traveler wiring 511. The traveler wiring 511 may couple the AC power source 506 to the lighting load 508 via the main dimmer 502, for example, to provide power to the lighting load 508. The one or more remote dimmers 514 may be coupled to the traveler wiring 511 via the hot terminal H'. Neutral wiring 512 may couple the lighting load 508 back to the AC power source 506, for example, to provide a return path for any remaining power provided by the AC power source 506 and not dissipated by the lighting load 508. The main dimmer 502 may be wired to the line side of the system 510 (e.g., as shown) or the load side of the system 510. Although the description herein is primarily with reference to the main dimmer 502 wired to the line side of the system 510, one or more embodiments may comprise the main dimmer 502 wired to the load side of the system 510 (e.g., and one or more remote dimmers 514 wired to the line side, accordingly). Further, any number of (e.g., more than two) remote dimmers 514 may be provided in the multiple location dimming system 510.

The hot terminal H' of the remote dimmers 514 may be connected to the dimmed hot terminal DH of the main dimmer 502 (e.g., as shown) and to the lighting load 508 via the traveler wiring 511, for example, if the main dimmer 502 is wired to the line side of the system 510. If the main dimer 502 is wired to the load side of the system 510, then the hot terminal H' of the remote dimmers 514 may be connected to the hot terminal H of the main dimmer 502 and to the AC power source 506 via the traveler wiring 511. The main dimmer 502 and the remote dimmers 514 may each comprise accessory dimmer terminals AD (i.e., accessory terminals) coupled together via a single accessory dimmer (AD) line 509 (i.e., an accessory wiring). The main dimmer 502 and the remote dimmers 514 may be operable to communicate, i.e., transmit and receive digital messages, via the AD line 509. The main dimmer 502 and the remote dimmers 514 may not include connections to the neutral side of the AC power source 506.

The main dimmer 502 and the remote dimmer 514 may include actuators and visual displays, such that lighting load 508 may be controlled from and feedback of the lighting load may be provided at each of the main dimmer 502 and the remote dimmers 514. In order to provide the visual displays at the remote dimmers 514, the remote dimmers 514 may include a control circuit (e.g., which may comprise a microprocessor) and a power supply for powering the microprocessor. The main dimmer 502 may provide an AD supply voltage VAD (e.g., approximately 80-170 VDC) on the AD line 509 to enable the power supplies of the remote dimmers 514 to charge during a first portion (i.e., a charging time $T_{CHRG}$) of a half-cycle of the AC power source 506. During a second portion (i.e., a communication time $T_{COMM}$) of the half-cycle, the main dimmer 502 and the remote dimmers 514 are operable to transmit and receive the digital messages via the AD line 509.

Figure 6:
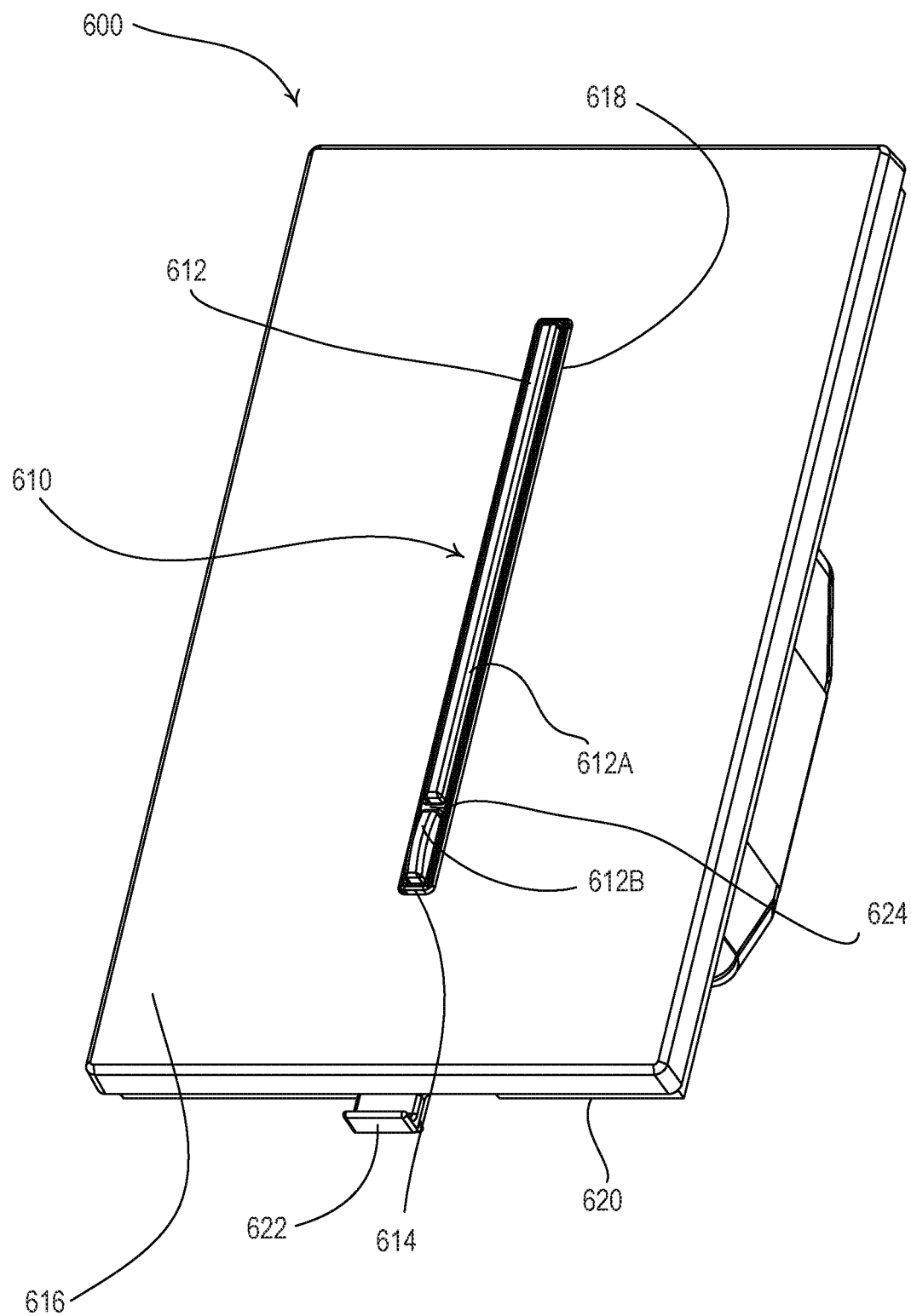
FIG. 6 is a perspective view of an example of a user interface of a load control device.

FIG. 6 is a diagram of an example user interface 600 of a load control device, which may be provided on, for example, the main dimmer 502 and/or the remote dimmers 504, 514 of the multiple location dimming system 500 shown in FIG. 5A and/or the multiple location dimming system 510 shown in FIG. 5B. The user interface 600 may include a thin touch sensitive actuator 610 comprising an actuation member 612 having first and second portions 612A, 612B. The actuation member 612 may extend through a bezel 614 to contact a touch sensitive device (not shown) located inside the main dimmer 502 and the remote dimmers 504, 514. The main dimmer 502 may be operable to control the intensity of a connected lighting load 508 in response to actuations of the actuation member 612 of either the main dimmer 502 or the remote dimmers 504, 514.

Figure 7:
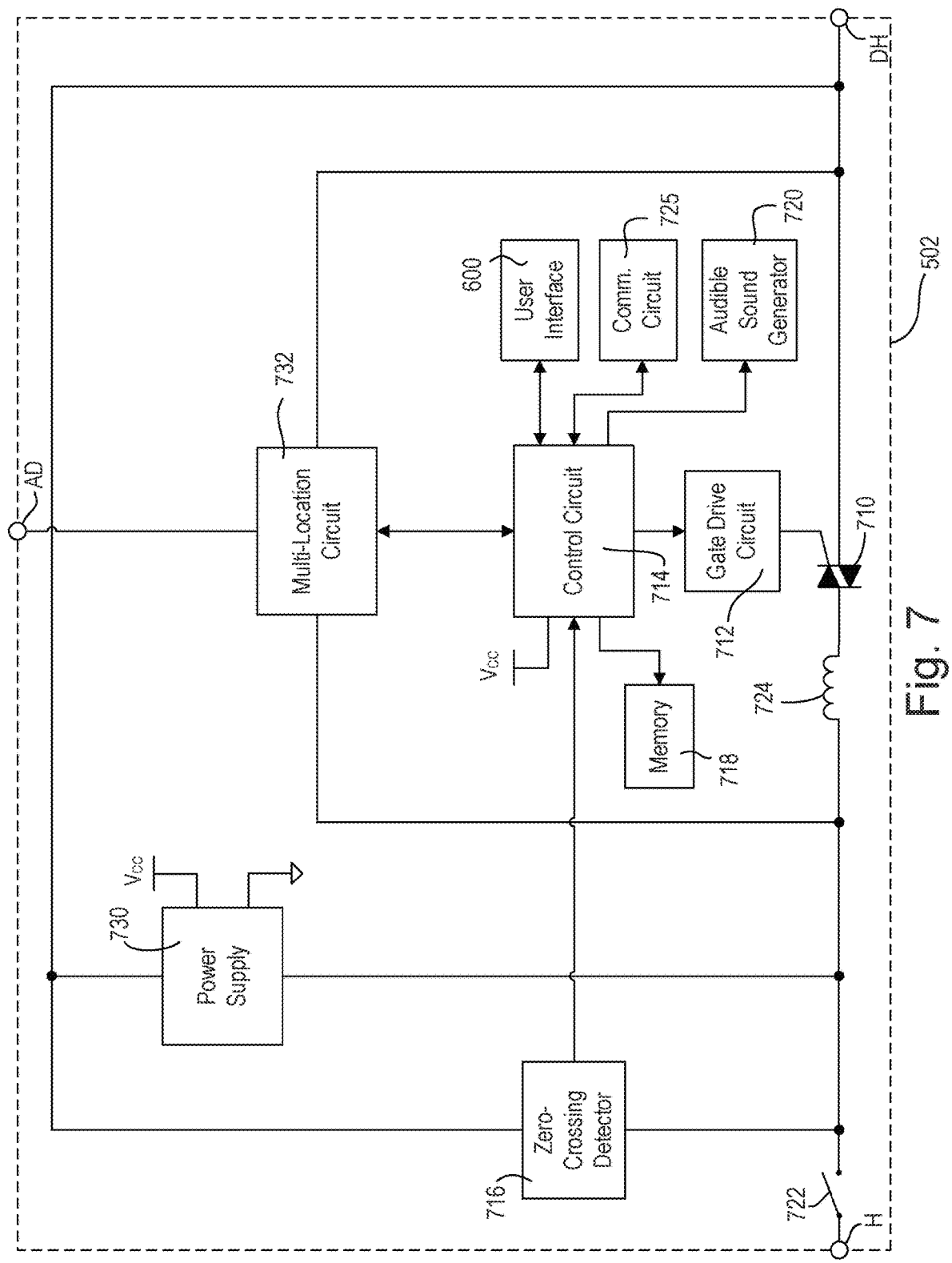
FIG. 7 is a block diagram of an example main load control device of a multiple location system.

The user interface 600 may comprise a faceplate 616, which may include a non-standard opening 618 and may mount to an adapter 620. The bezel 614 may be housed behind the faceplate 616 and extend through the opening 618. The adapter 620 may connect to a yoke (not shown), which may be adapted to mount the main dimmer 502 and the remote dimmers 504, 514 to standard electrical wall-boxes. An air-gap actuator 622 may allow for actuation of an internal air-gap switch (e.g., an internal air-gap switch 722 as shown in FIG. 7) by pulling the air-gap actuator 622 down.

The bezel 614 may comprise a break 624, which may separate the lower portion 612A and the upper portion 612B of the actuation member 612. Upon actuation of the lower portion 612B of the actuation member 612, the main dimmer 502 may cause the connected lighting load 508 to toggle from on to off, and vice versa. Actuation of the upper portion 612A of the actuation member 612, i.e., above the break 624, may cause the intensity of the lighting load 508 to change to a level dependent upon the position of the actuation along the length of the actuation member 612.

A plurality of visual indicators, e.g., a plurality of light-emitting diodes (LEDs), may be arranged in a linear array behind the actuation member 612. The actuation member 612 may be substantially transparent, such that the LEDs are operable to illuminate portions of the actuation member. Two different color LEDs may be located behind the lower portion 612B, such that the lower portion is illuminated, for example, with white light when the lighting load 508 is on and with orange light with the lighting load is off. The LEDs behind the upper portion 612A may be, for example, white and may be illuminated as a bar graph to display the intensity of the lighting load 508 when the lighting load is on.

The touch sensitive actuator 610 of the user interface 600 may be described in greater detail in commonly-assigned U.S. Pat. No. 7,791,595, issued Sep. 7, 2010, entitled TOUCH SCREEN ASSEMBLY FOR A LIGHTING CONTROL, the entire disclosure of which is hereby incorporated by reference.

FIG. 7 is a block diagram of an example main load control device of a multiple location load control system, e.g., the main dimmer 502. The main dimmer 502 may comprise a bidirectional semiconductor switch 710, a gate drive circuit 712, a control circuit 714, a zero-crossing detector 716, a memory 718, an audible sound generator 720, an air-gap switch 722, an inductor 724, a communication circuit 725, the user interface 600, and/or a multi-location circuit 732.

The main dimmer 502 may employ the bidirectional semiconductor switch 710 (e.g., a triac) coupled between the hot terminal H and the dimmed hot terminal DH, to control the current through, and thus the intensity of, the lighting load 508. The semiconductor switch 710 may be implemented as any suitable bidirectional semiconductor switch, such as, for example, a FET in a full-wave rectifier bridge, two FETs in anti-series connection, or one or more insulated-gate bipolar junction transistors (IGBTs). The semiconductor switch 710 may comprise a control input (e.g., gate), which is connected to the gate drive circuit 712. The input to the gate may render the semiconductor switch 710 selectively conductive or non-conductive, which in turn may control the power supplied to the lighting load 508.

The control circuit 714 may be operable to control the semiconductor switch 710 by providing a control signal to the gate drive circuit 712 using the forward phase control dimming technique and/or the reverse phase control dimming technique. For example, the control circuit 714 may comprise a microcontroller, a microprocessor, a programmable logic device (PLD), a field programmable grid array (FPGA), an application specific integrated circuit (ASIC), or any suitable processing device, controller, or control circuit. The control circuit 714 may be coupled to a zero-crossing detect circuit 716, which may determine the zero-crossing points of the AC line voltage from the AC power supply 506. The control circuit 714 may generate the gate control signals to operate the semiconductor switch 710 to thus provide voltage from the AC power supply 506 to the lighting load 508 at predetermined times relative to the zero-crossing points of the AC line voltage.

The user interface 600 may be coupled to the control circuit 714, such that the control circuit 714 is operable to receive inputs from the touch sensitive actuator 610 and to control the LEDs to provide feedback of the amount of power presently being delivered to the lighting load 508. An example of the electrical circuitry of the user interface 600 may be described in greater detail in co-pending, commonly-assigned U.S. Pat. No. 7,855,543, issued Dec. 21, 2010, entitled FORCE INVARIANT TOUCH SENSITIVE ACTUATOR, the entire disclosure of which is hereby incorporated by reference.

The main dimmer 502 may further comprise an audible sound generator 718 coupled to the control circuit 714. The control circuit 714 may be operable to cause the audible sound generator 718 to produce an audible sound in response to an actuation of the touch sensitive actuator 610. A memory 718 may be coupled to the control circuit 714 and may be operable to store control information of the main dimmer 502.

The air-gap switch 722 may be coupled in series between the hot terminal H and the semiconductor switch 710. The air-gap switch 722 may have a normally-closed state in which the semiconductor switch 710 is coupled in series electrical connection between the AC power source 506 and the lighting load 508. When the air-gap switch 722 is actuated (i.e., in an open state), the air-gap switch may provide an actual air-gap break between the AC power source 506 and the lighting load 508. The air-gap switch 722 may allow a user to service the lighting load 508 without the risk of electrical shock. The main dimmer 502 may comprise the inductor 724 (i.e., a choke) for providing electromagnetic interference (EMI) filtering.

The main dimmer 502 may comprise a power supply 730 for generating a DC supply voltage $V_{CC}$ (e.g., approximately 3.3 volts) for powering the control circuit 714 and other low voltage circuitry of the main dimmer 502. The power supply 730 may draw (e.g., only draw) current at the beginning of a half-cycle (e.g., each half-cycle) while the bidirectional semiconductor switch 710 is non-conductive, for example, if the forward phase control dimming technique is used. The power supply 730 may draw (e.g., only draw) current at the end (i.e., trailing edge) of a half-cycle (e.g., each half-cycle) while the bidirectional semiconductor switch 710 is non-conductive, for example, if the reverse phase control dimming technique is used. The power supply 730 may stop drawing current when the bidirectional semiconductor switch 710 is rendered conductive.

The multi-location circuit 732 may be coupled between the hot terminal H and/or the dimmed hot terminal DH and an accessory dimmer terminal AD (which may be adapted to be coupled to the AD line 509). The multi-location circuit 732 may provide a supply voltage to the remote dimmer 504, 514 via the AD line 509 and/or allow for communication of a digital message between the main dimmer 502 and the remote dimmers 504, 514 via the AD line 509. The control circuit 714 may provide a control signal to the multi-location circuit. If the main dimmer 502 is located on the line side of the system 500/510, then the control circuit 714 may control the multi-location circuit 732 to allow the remote dimmers 504, 514 to charge their internal power supplies and transmit and receive digital messages during the positive half-cycles. If the main dimmer 502 is located on the load side of the system 500/510, then the control circuit 714 may control the multi-location circuit 732 to allow the remote dimmers 504, 514 to charge their internal power supplies and transmit and receive digital messages during the negative half-cycles.

The main dimmer 502 may comprise another communication circuit 725 (e.g., in addition to the multi-location circuit 732) for transmitting or receiving digital messages via a communications link, for example, a wired serial control link, a power-line carrier (PLC) communication link, or a wireless communication link, such as an infrared (IR) or a radio-frequency (RF) communication link. An example of a load control device able to transmit and receive digital messages on an RF communication link is described in commonly assigned U.S. Pat. No. 5,905,442, issued May 18, 1999, entitled METHOD AND APPARATUS FOR CONTROLLING AND DETERMINING THE STATUS OF ELECTRICAL DEVICES FROM REMOTE LOCATIONS, the entire disclosure of which is hereby incorporated by reference.

Figure 8A:
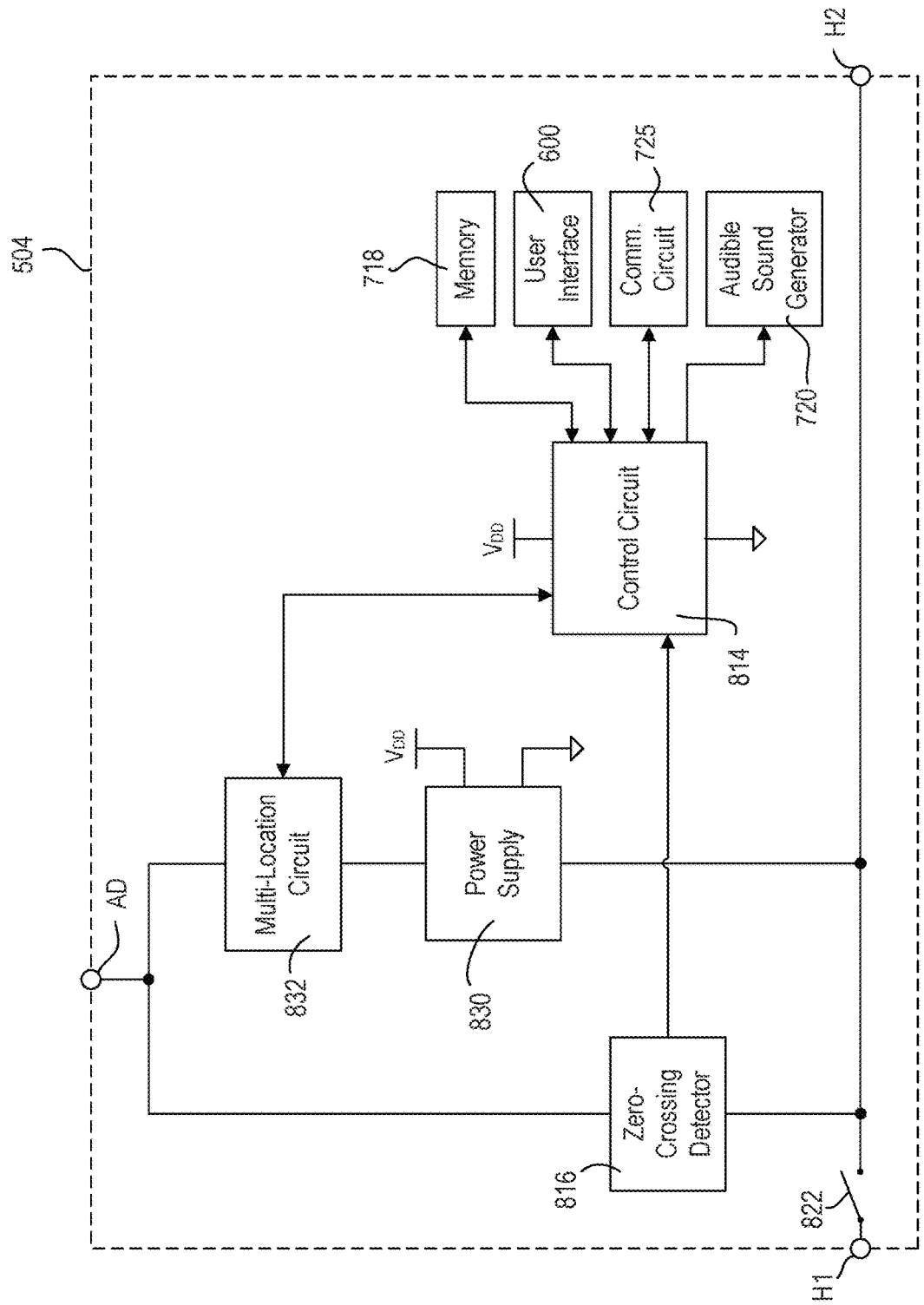
FIG. 8A is a block diagram of an example remote load control device of a multiple location system.

FIG. 8A is a diagram of an example remote load control device of a multiple location load control system, e.g., the remote dimmer 504 of the load control system 500 shown in FIG. 5A. The remote dimmer 504 may comprise one or more of the same functional blocks as the main dimmer 502. The remote dimmer 504 may comprise a control circuit 814, a zero-crossing detector 816, an air-gap switch 822, a multi-location circuit 832, a power supply 830, the user interface 600, the memory 718, the audible sound generator 720, and/or the communication circuit 725.

The control circuit 814 may comprise a microcontroller, a microprocessor, a programmable logic device (PLD), a field programmable grid array (FPGA), an application specific integrated circuit (ASIC), or any suitable processing device, controller, or control circuit. The control circuit 814 may be coupled to a zero-crossing detect circuit 816, which may determine the zero-crossing points of the AC line voltage from the AC power supply 506. The user interface 600 may be coupled to the control circuit 814, such that the control circuit 814 is operable to receive inputs from the touch sensitive actuator 610 and to control the LEDs to provide feedback of the amount of power presently being delivered to the lighting load 508.

The remote dimmer 504 may comprise first and second hot terminals H1, H2 that may be coupled in series with the bidirectional semiconductor switch 710 of the main dimmer 502, and may be adapted to conduct the load current from the AC power source 506 to the lighting load 508. The remote dimmer 504 may also comprise an accessory dimmer terminal AD that is adapted to be coupled to the accessory dimmer terminal AD of the main dimmer 502 via the AD line 509.

Figure 9:
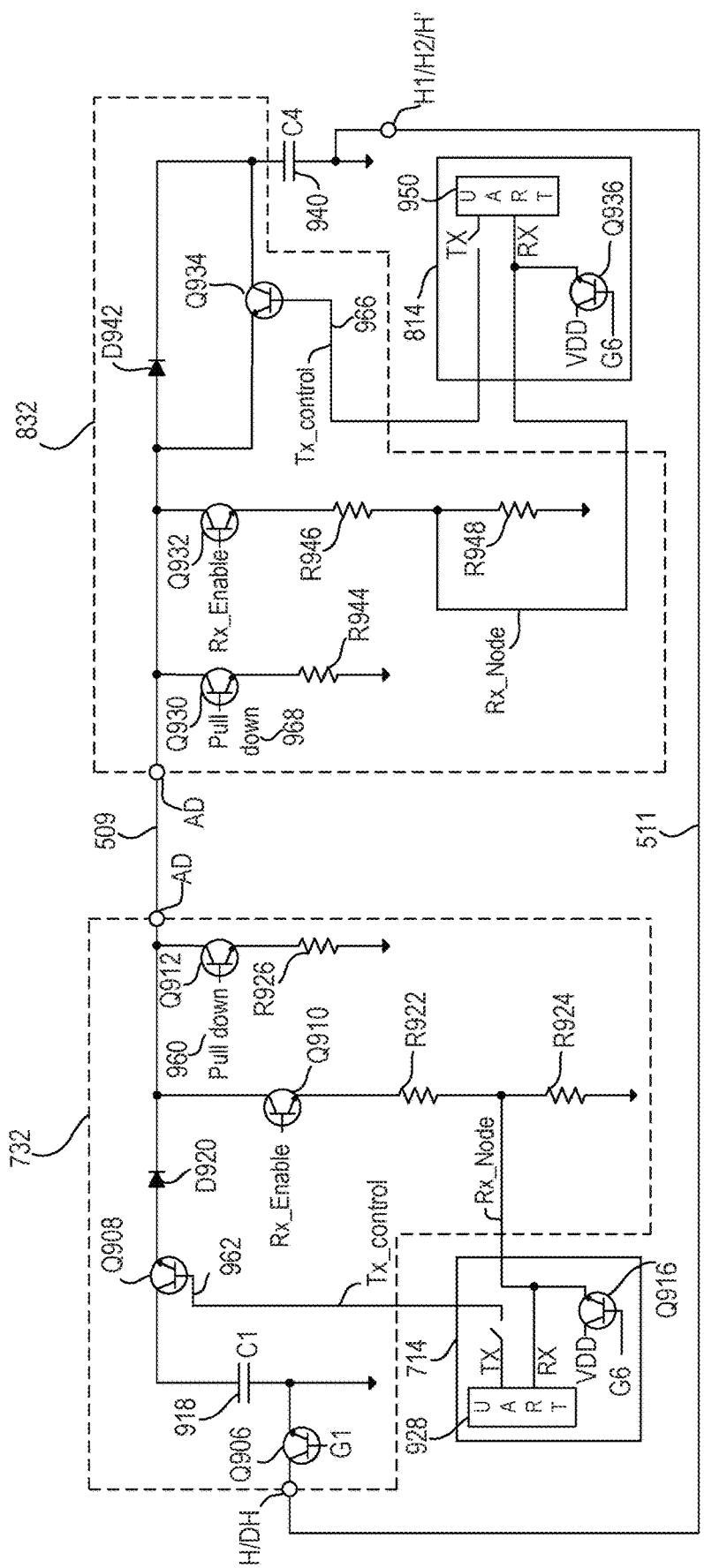
FIG. 9 is an example schematic diagram of the multi-location circuit and control circuit of the main load control device and the multi-location circuit and control circuit of the remote load control device of the system of FIG. 5A or FIG. 5B.

The power supply 830 may be coupled between the multi-location circuit 832 and the first and second hot terminals H1, H2 to draw power from the main dimmer 502, via the multi-location circuit 832, during the charging time period $T_{CHRG}$ of a half-cycle. The power supply 830 may generate a DC output voltage $V_{DD}$ (e.g., approximately 3.3 volts) for powering the control circuit 814 and other low voltage circuitry of the remote dimmer 504. The power supply 830 may comprise a capacitor 940, for example, as shown in FIG. 9.

The zero-crossing detector 816 may be coupled between the accessory dimmer terminal AD and the first and second hot terminals H1, H2. The zero-crossing detector 816 may detect a zero-crossing and/or may couple the AD supply voltage VAD across the zero-crossing detector 816. The control circuit 814 may begin timing at a zero-crossing (e.g., each zero-crossing) and may be operable to transmit and receive digital messages via the multi-location circuit 832, for example, after the charging time period $T_{CHRG}$ expires. The multi-location circuit 832 may be coupled between the AD line 509 and the power supply 830. The multi-location circuit 832 and power supply 830 of the remote dimmer 504 may be coupled in parallel with the multi-location circuit 732 of the main dimmer 502 forming a communication path during the communication time period $T_{COMM}$ in the positive and/or negative half-cycles, for example, depending on which side of the system 500/510 to which the main dimmer 502 is coupled. Accordingly, the communication path between the main dimmer 502 and the remote dimmer 504 may not pass through the AC power source 506 or the lighting load 508.

The opening of the air-gap switch 822 of the remote dimmer 504 may provide a true air-gap disconnect between the AC power source 506 and the lighting load 508. The zero-crossing detector 816, the power supply 830, and the multi-location circuit 832 of the remote dimmer 504 may include diodes coupled to the accessory dimmer terminal AD, such that the accessory dimmer terminal AD of the remote dimmer 504 may be operable (e.g., only operable) to conduct current into the remote dimmer 504. The path for leakage current through the system 500 may be through the dimmed hot terminal DH and out of the accessory dimmer terminal AD of the main dimmer 502. The orientation of the first and second hot terminals H1 and H2 of the remote dimmer 504 with respect to the main dimmer 502 may be reversed, for example, such that the second hot terminal H2 of the remote dimmer 504 may be coupled to the dimmed hot terminal DH of the main dimmer 502 and the first hot terminal H1 of the remote dimmer 504 may be coupled to the lighting load 508. This may be performed to the path for leakage current to the lighting load 508 through the accessory dimmer terminal AD of the remote dimmer 504. The components chosen for these circuits may be such that the magnitude of the leakage current through the main dimmer 502 is limited to an appropriate level to meet the UL standard for leakage current when the air-gap switch 722 is opened.

When any of the main dimmer 502 and the remote dimmers 504 are wired directly to the AC power source 506 and the lighting load 508, the respective air-gap switches 722, 822 may be positioned towards the AC power source and the lighting load, such that opening the air-gap switches 722, 822 may provide a true air-gap disconnect between the AC power source 506 and the lighting load 508. However, if any of the main dimmer 502 and the remote dimmers 504 that are wired directly to the AC power source 506 and the lighting load 508 do not have their air-gap switches 722, 822 positioned towards the AC power source 506 and the lighting load 508, the leakage current through the main dimmer 502 and the remote dimmers 504 may be limited to meet the UL standard for leakage current when an air-gap switch is opened. The leakage current may be limited in this way when the air-gap switches 722, 822 of any of the remote dimmers 504 that are wired in the middle of the system 500 are opened.

Figure 8B:
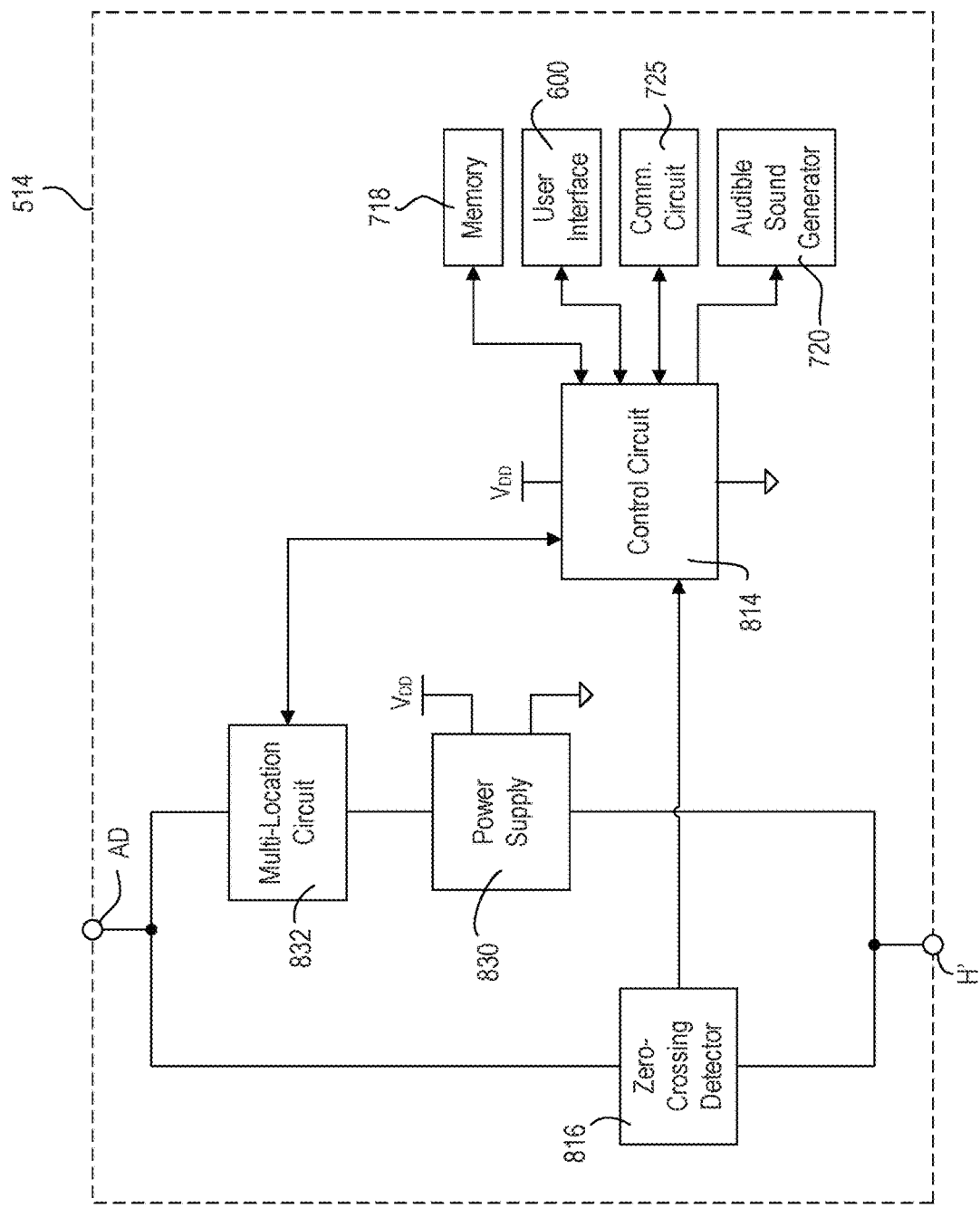
FIG. 8B is a block diagram of another example remote load control device of a multiple location system.

FIG. 8B is a diagram of another example remote load control device of a multiple location load control system, e.g., the remote dimmer 514 of the load control system 510 shown in FIG. 5B. The remote dimmer 514 may comprise one or more of the same functional blocks as the remote dimmer 504. The remote dimmer 514 may comprise a control circuit 814, a zero-crossing detector 816, a multi-location circuit 832, a power supply 830, the user interface 600, the memory 718, the audible sound generator 720, and/or the communication circuit 725. One or more of the embodiments described herein with reference to the remote dimmers 504 (e.g., those associated with FIG. 9-18) may be applicable to the remote dimmers 514.

The remote dimmer 514 may not comprise an air-gap switch 822. As such, the remote dimmer 514 may comprise a single hot terminal H' as opposed to the first and second hot terminals H1 and H2. The single hot terminal H' of the remote dimmer 514 may be connected to the dimmed hot terminal DH of the main dimmer 502 and to the lighting load 508 (e.g., and the single H terminal of one or more additional remote dimmers 514), for example, as illustrated in FIG. 5B. Alternatively, the single hot terminal H' may be connected to the hot terminal H of the main dimmer 502 and the AC power source 506, for example, if the main dimmer 502 is wired to the line side. The single hot terminal H' of the remote dimmer 514 may be coupled to the bidirectional semiconductor switch 710 of the main dimmer 502, for example, via the H or DH terminal. The remote dimmer 514 may not be adapted to conduct the load current from the AC power source 506 to the lighting load 508, since for example, the DH terminal of the main dimmer 502 may be connected directly to the lighting load 508 (e.g., without traveling through the remote dimmer 514). The accessory dimmer terminal AD of the remote dimmer 514 may be adapted to be coupled to the accessory dimmer terminal AD of the main dimmer 502 via the AD line 509.

FIG. 9 is an example schematic diagram of a multi-location circuit and a control circuit, e.g., the multi-location circuit 732 and control circuit 714 of the main dimmer 502, and/or the multi-location circuit 832 and control circuit 814 of the remote dimmer 504 and/or the remote dimmer 514. Although described with respect to the remote dimmer 504, the description of FIG. 9 may be applicable to the remote dimmer 514, either entirely or in part. The main dimmer 502 may be connected to the remote dimmers 504 via the AD line 509 and the traveler line 511. The traveler line 511 may be connected between the hot terminal or dimmed hot terminal of the main dimmer 502 and one of the hot terminals of the remote dimmer 504, for example, depending on whether the main dimmer 502 is configured on the line side or the load side of the system 500. The main dimmer 502 may communicate (i.e., transmit and receive digital messages) and deliver power to a remote dimmer 504 via the AD line 509.

The multi-location circuit 732 of the main dimmer 502 may comprise an NPN bipolar junction transistor Q906, an NPN bipolar junction transistor Q908, an NPN bipolar junction transistor Q910, an NPN bipolar junction transistor Q912, a capacitor 918, a diode D920, a resistor R922, a resistor R924, and/or a resistor R926. The control circuit 714 of the main dimmer 502 may comprise a universal asynchronous receiver/transmitter (UART) 928 and/or an NPN bipolar junction transistor Q916. The UART 928 may be an internal circuit of a microprocessor of the control circuit 714.

The collector of the transistor Q906 may be connected to the hot terminal of the main dimmer 502. The emitter of the transistor Q906 may be connected to the non-isolated circuit common and may be connected to the collector of the transistor Q908 through the capacitor 918. The collector of the transistor Q908 may be connected to the non-isolated circuit common through the capacitor 918 and the emitter of the transistor Q908 may be connected to the AD line 509 through the diode D920. The base of the transistor Q908 may be connected to the transmit node of the UART 928. The collector of the transistor Q910 may be connected to the AD line 509 and the emitter of the transistor Q910 may be connected to the non-isolated circuit common through the resistors R922, R924. The junction of the resistors R922, R924 may be coupled to the receive node (Rx) of the UART 928. The collector of the transistor Q912 may be connected to the AD line 509 and the emitter of the transistor Q912 may be connected to the non-isolated circuit common through the resistor R926.

The multi-location circuit 732 of the remote dimmer 504 may comprise an NPN bipolar junction transistor Q930, an NPN bipolar junction transistor Q932, an NPN bipolar junction transistor Q934, a diode D942, a resistor R944, a resistor R946, and/or a resistor R948. The control circuit 814 of the remote dimmer 504 may comprise a universal asynchronous receiver/transmitter (UART) 950 and an NPN bipolar junction transistor Q936. The remote dimmer 504 may comprise a capacitor 940, which may be coupled across the input of the power supply 830 of the remote dimmer 504. As such, the capacitor 940 may be coupled between the multi-location circuit 832 and a hot terminal H1/H2/H' to charge through the diode D942 from the main dimmer 502, via the multi-location circuit 832, during the charging time period $T_{CHRG}$ of a half-cycle. The power supply 830 may conduct current from the main dimmer 502 and/or from the capacitor 940 to generate the DC supply voltage $V_{DD}$ for powering the control circuit 1114 and other low voltage circuitry of the remote dimmer 504.

The collector of the transistor Q930 may be connected to the AD line 509 and the emitter of the transistor Q930 may be connected to the non-isolated circuit common through the resistor R944. The collector of the transistor Q932 may be connected to the AD line 509 and the emitter of the transistor Q932 may be connected to the non-isolated circuit common through the resistors R946, R948. The junction of the resistors R946, 948 may be coupled to the receive node (Rx) of the UART 950. The collector of the transistor Q934 may be connected to the capacitor 940 and the emitter of the transistor Q934 may be connected to the AD line 509. The base of the transistor Q934 may be connected to the transmit node of the UART 950.

The main dimmer 502 and/or the remote dimmer 504 may control the AD line 509 using tri-state logic. Tri-state logic may be referred to as tri-state communication, three-state logic, 3-state logic, and/or the like. The sender (e.g., the main dimmer 502 or the remote dimmer 504) may controlling the AD line 509 into one of three states, an active pull-up state, and active pull-down state, or a high impedance state. The main dimmer 502 and/or the remote dimmer 504 may control the AD line 509 using tri-state logic to, for example, charge a power supply (e.g., capacitor 940) of the remote dimmer 504 and/or communicate with one another.

Figure 10:
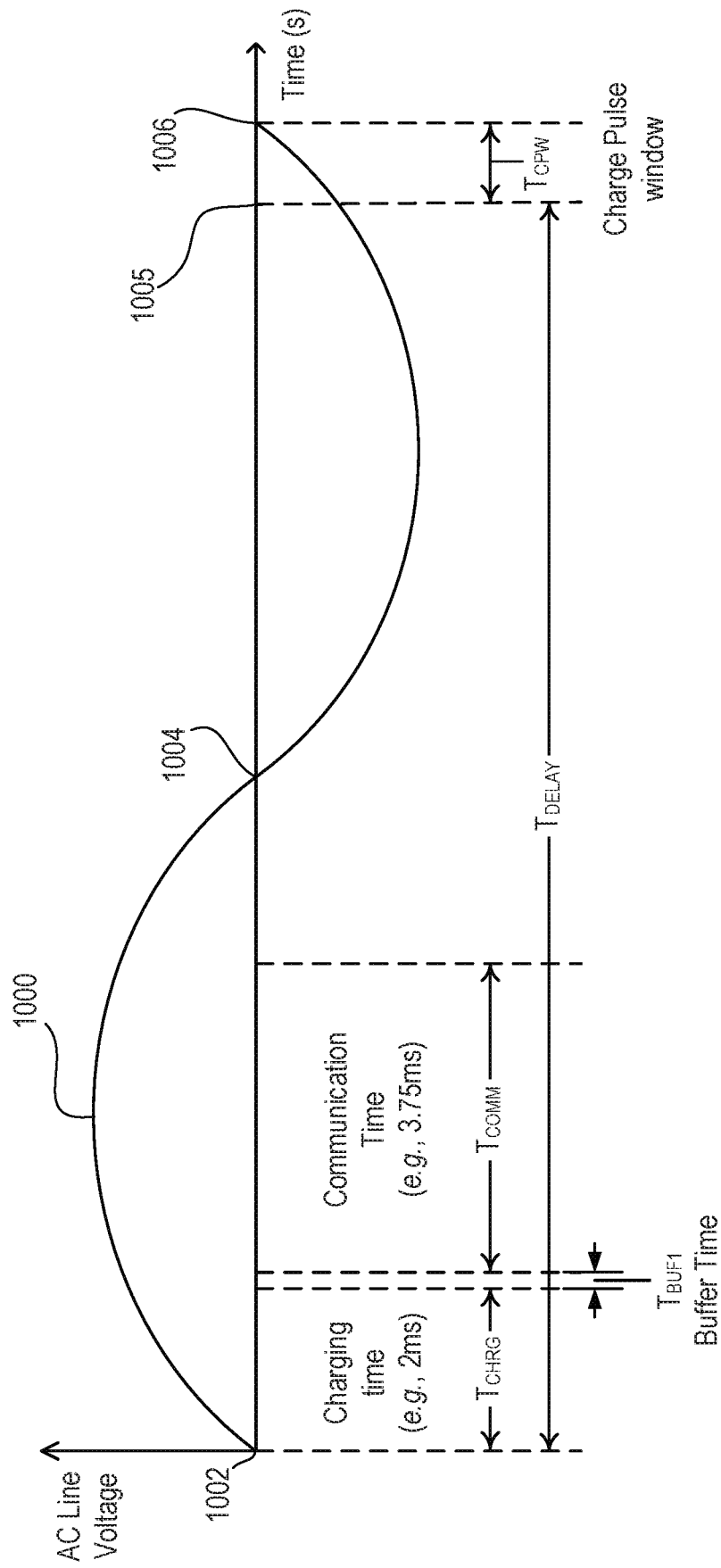
FIG. 10 is a timing diagram of an example of a complete line cycle of an AC voltage waveform provided by an AC power source.

The main dimmer 502 may charge the capacitor 940 of the remote dimmer 504 during a half-cycle of an AC voltage waveform (e.g., as shown in FIG. 10) using the AD line 509. The main dimmer 502 may actively pull up the AD line 509 to generate an AD supply voltage VAD on the AD line 509 during the changing time period $T_{CHRG}$. In the active pull up state, the potential between the AD line 509 and the traveler line 511 may vary between approximately 80 to 170 volts. To pull up the AD line 509 during the charging time period $T_{CHRG}$, the transistor Q906 and the transistor Q908 of the main dimmer 502 may be rendered conductive, while the transistor Q910 and the transistor Q912 of the main dimmer 502, and the transistor Q930, the transistor Q932, and the transistor Q934 of the remote dimmer 504 may not be rendered conductive. As such, a current from the AC power source 506 may be conducted through the transistor Q906 to charge the capacitor 918 of the main dimmer 502. In addition, a charging current may be conducted from the capacitor 918 through the transistor Q908, the diode D920, the AD line 509, and the diode D942 to charge the capacitor 940 of the remote dimmer 504. Therefore, the capacitor 940 of the remote dimmer 504 maybe charged by the main dimmer 502 via the AD line 509 and the multi-location circuit 832 and the power supply 830 may generate the DC supply voltage $V_{DD}$. Residual current from the AC power source 506 provided after the capacitor 940 is fully charged may return via the traveler wire 511.

The main dimmer 502 and the remote dimmer 504 may communicate during a half-cycle of an AC voltage waveform (e.g., as shown in FIG. 10) using the AD line 509. For example, the main dimmer 502 may charge the capacitor 940 of the remote dimmer 504, and the main dimmer 502 and the remote dimmer 504 may communicate at least a portion of a digital message during a single half-cycle of an AC voltage waveform.

The main dimmer 502 and the remote dimmers 504 may communicate with one another by controlling the AD line 509. For example, the main dimmer 502 and/or the remote dimmer 504 may communicate by placing the AD line 509 in an active pull-up state and/or an active pull-down state. The receiver (e.g., the main dimmer 502 or the remote dimmer 504) may interpret a "1" bit when the AD line 509 is in the active pull-up state, a "0" bit when the AD line 509 is in the active pull-down state, and nothing when the AD line 509 is in the high impedance state. In the active pull up state, the potential between the AD line 509 and the traveler wire 511 may vary between approximately 80 to 170 volts. In the active pull down state, there may be no potential between the AD line 509 and the traveler wire 511. In the high impedance state, the potential between the AD line 509 and the traveler wire 511 may depend on the charge stored by the line capacitance of the electrical wiring between the main dimmer 502 and the remote dimmer 504, i.e., the AD line 509. The use of the active pull-up state and active-pull down state may allow for faster and/or more reliable communication, for example, because the active pull-up state and active-pull down state may be characterized by sharper edges between communications.

When the main dimmer 502 is transmitting a digital message to the remote dimmer 504, the transistor Q906 of the main dimmer 502 may be rendered conductive. To receive a digital message from the main dimmer 502, the remote dimmer 504 may render the transistor Q932 conductive (e.g., via the Rx_Enable line at the base of the transistor Q932). To place the AD line 509 in the active pull up state, the main dimmer 502 may render the transistor Q908 conductive and the transistor Q912 non-conductive. As such, the AD line 509 is pulled up (i.e., pulled-up to approximately 80-170 volts) and the remote dimmer 504 (i.e., the UART 950 of the control circuit 814) interprets a "1" bit being communicated. To place the AD line 509 in the active pull down state, the main dimmer 502 may render the transistor Q908 non-conductive and the transistor Q912 conductive. As such, the AD line 509 is pulled down and has substantially the same voltage potential as the traveler wire 511. When the AD line 509 is pulled-down, the remote dimmer 504 interprets a "0" bit being communicated. For example, the transistor Q912 may be rendered conductive (e.g., only rendered conductive) to transmit a "0" bit. Therefore, the main dimmer 502 may render a first switching circuit (e.g., transistor Q908) and a second switching circuit (e.g., transistor Q912) conductive and non-conductive on a complementary basis to transmit a digital message to the remote dimmer 504 via the AD line 509 during the communication period $T_{COMM}$ of the half-cycle of the AC power source. For example, during communication, the main dimmer 502 may actively pull-up or pull-down the AD line 509 to communicate a "1" bit or a "0" bit, respectively, by rendering the transistors Q908, Q912 conductive or non-conductive on a complementary basis.

When the remote dimmer 504 is transmitting a digital message to the main dimmer 502, the transistor Q934 of the remote dimmer 504 may be rendered conductive. To receive a digital message from the remote dimmer 504, the main dimmer 502 may render the transistor Q910 conductive (e.g., via the Rx_Enable line at the base of the transistor Q910). To place the AD line 509 in the active pull up state, the remote dimmer 504 may render the transistor Q934 conductive and the transistor Q930 non-conductive. As such, the AD line 509 is pulled up (i.e., pulled-up to approximately 80-170 volts) and the main dimmer 502 (i.e., the UART 928 of the control circuit 714) interprets a "1" bit being communicated. To place the AD line 509 in the active pull down state, the remote dimmer 504 may render the transistor Q934 non-conductive and the transistor Q930 conductive. As such, the AD line 509 is pulled down and has substantially the same voltage potential as the traveler wire 511. When the AD line 509 is pulled-down, the main dimmer 502 interprets a "0" bit being communicated. For example, the transistor Q930 may be rendered conductive (e.g., only rendered conductive) to transmit a "0" bit. Therefore, the remote dimmer 504 may render a first switching circuit (e.g., transistor Q934) and a second switching circuit (e.g., transistor Q930) conductive and non-conductive on a complementary basis to transmit a digital message to the main dimmer 502 via the AD line 509 during the communication period $T_{COMM}$ of the half-cycle of the AC power source. For example, during communication, the remote dimmer 504 may actively pull-up or pull-down the AD line 509 to communicate a "1" bit or a "0" bit, respectively, by rendering the transistors Q930, Q934 conductive or non-conductive on a complementary basis.

The AD line 509 may be placed in the high impedance state. To place the AD line 509 in the high impedance state, the transistor Q906 may be rendered conductive and the transistors Q908, Q910, and Q912 of the main dimmer 502 and the transistors Q930, Q932, and Q934 of the remote dimmer may be rendered non-conductive. As such, in the high impedance state, the potential between the AD line 509 and the traveler wire 511 may depend on the charge stored by the AD line 509. The interpretation of the AD line 509 by the receiver (e.g., the main dimmer 502 or the remote dimmer 504) in the high impedance state is indeterminable. The multi-location circuits 732, 832 dissipate less power in the high impedance state.

In the multi-location circuit 732, the Pull down line 960 of the transistor Q912 may be the inverted version of the Tx_control line 962 at the base of the transistor Q908. For example, an inverter circuit (not shown) may be located between the base of the transistor Q912 (i.e., on the Pull down line 960) and the base of the transistor Q908 (i.e., on the Tx_control line 962). The Pull down line 960 also may be coupled (not shown) to the control circuit 714 (e.g., to an open drain output of a microprocessor), so that the control circuit 714 may pull down the base of the transistor Q912 to render the transistor Q912 non-conductive during the high impedance state (i.e., to disable control of the transistor Q912 in response to the Pull down line 960). The transistor Q912 may be rendered conductive (e.g., only rendered conductive) when the transistor Q908 is rendered non-conductive during the communication time.

In the multi-location circuit 832, the Pull down line 968 of the transistor Q930 may be the inverted version of the Tx_control line 966 at the base of the transistor Q934. For example, an inverter circuit (not shown) may be located between the base of the transistor Q930 (i.e., on the Pull down line 968) and the base of the transistor Q934 (i.e., on the Tx_control line 966). The Pull down line 968 may be coupled (not shown) to the control circuit 814 (e.g., to an open drain output of a microprocessor), so that the control circuit 814 may pull down the base of the transistor Q930 to render the transistor Q930 non-conductive during the high impedance state (i.e., to disable control of the transistor Q912 in response to the Pull down line 968). The transistor Q930 may be rendered conductive (e.g., only rendered conductive) when the transistor Q934 is rendered non-conductive during the communication time.

FIG. 10 is a timing diagram of an example of a complete line cycle of an AC voltage waveform 1000 provided by an AC power source (e.g., the AC power source 506). The timing diagram of FIG. 10 illustrates an example of the operation of a main dimmer 502 during each half-cycle of the AC voltage waveform 1000. The main dimmer 502 may be operable to allow one or more remote dimmers 504 connected to the AD line 509 to charge their internal power supplies (i.e., capacitor 940) during a charging time period $T_{CHRG}$. The charging time period $T_{CHRG}$ may occur after a zero-crossing 1002 at the beginning of the positive half-cycle of the AC voltage waveform 1000. The charging time period $T_{CHRG}$ may be approximate 2 ms in duration. The AD line 509 may be pulled up by the main dimmer 502 during the charging time period $T_{CHRG}$ to charge the capacitors 940 of the remote dimmers 504, for example, as described with reference to FIG. 9.

After the charging time period $T_{CHRG}$, a first buffer time $T_{BUF1}$ may be used to ensure that the state of the AD line 509 during the charging time period $T_{CHRG}$ is not misinterpreted as part of a digital message during the communication time period $T_{COMM}$.

After the buffer time $T_{BUF1}$, the main dimmer 502 and one or more of the remote dimmers 504 may be operable to transmit and receive digital messages via the AD line 509 during the communication time period $T_{COMM}$. The communication time period $T_{COMM}$ may occur after the buffer time $T_{BUF1}$ and during the positive half-cycle of the AC voltage waveform 1000. The communication time period $T_{COMM}$ may be approximate 3.75 ms. The communication time period $T_{COMM}$ may be a dedicated time slot for communication between the main dimmer 502 and one or more remote dimmers 504. The main dimmer 502 and/or a remote dimmer 504 may pull up and/or pull down the AD line 509 to transmit a digital message, for example, as described with reference to FIG. 9. As such, communication between the main dimmer 502 and one or more remote dimmers 504 may be performed during the communication time period $T_{COMM}$ using the active pull-up state and/or the active-pull down state. After the communication time period $T_{COMM}$, the AD line 509 may be in a high impedance state (i.e., the high impedance state).

The remote dimmer 504 may monitor for the beginning of a charge pulse during a charge pulse window $T_{CPW}$ right before the next zero-crossing 1006. The charge pulse may occur during the charging time period $T_{CHRG}$ each line cycle. The charge pulse window $T_{CPW}$ may begin after a charge pulse window delay period TDELAY, which may have a duration of approximately 14 ms measured from the zero-crossing 1002. The charge pulse window $T_{CPW}$ may begin at a time 1005 before the zero-crossing 1006 between the negative half-cycle of the AC voltage waveform 1000 and a subsequent cycle of the AC voltage waveform 1000, for example, as shown in FIG. 10. During the charge pulse window $T_{CPW}$, the remote dimmers 504 may open their charge pulse detect window, which may be used by the remote dimmers 504 to stay in synchronization with the main dimmer 502. For example, the rising edge of the charge pulse during the charging time period $T_{CHRG}$ may be detected by the zero-cross detector 816 to establish the timing for the rest of the line cycle. The AD line 509 may be in a high impedance state (i.e., the high impedance state) during the charge pulse window $T_{CPW}$.

Although illustrated as comprising the charging time period $T_{CHRG}$ and the communication time period $T_{COMM}$ during the positive half-cycle of the AC voltage waveform 1000 but not the negative half-cycle of the AC voltage waveform 1000, in one or more embodiments, the AC voltage waveform 1000 may include a charging time period $T_{CHRG}$ and a communication time period $T_{COMM}$ during the negative half-cycle of the AC voltage waveform 1000 but not the positive half-cycle of the AC voltage waveform 1000.

Figure 11:
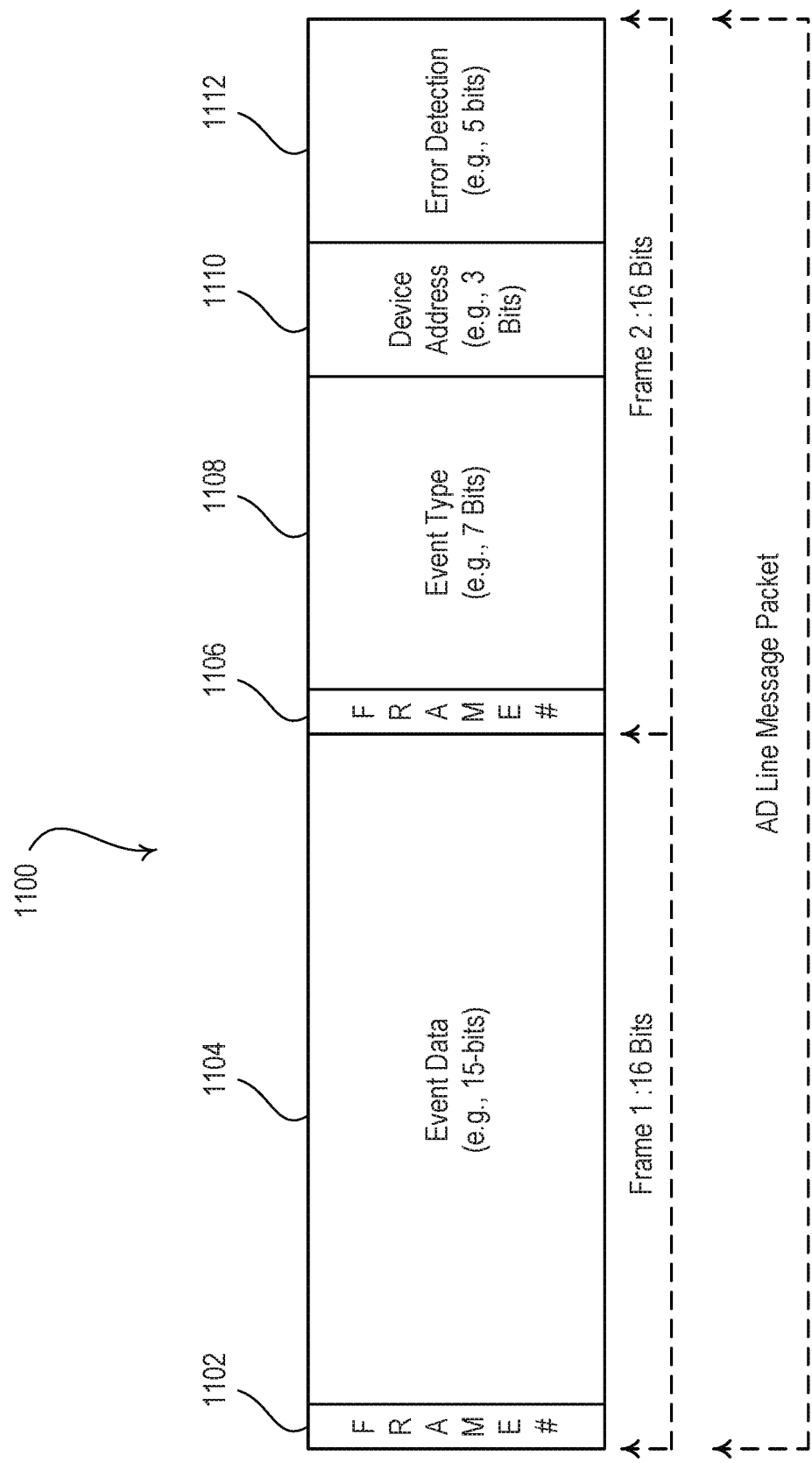
FIG. 11 is a diagram of an example of a payload format for communication between the main load control device and the remote load control device of the system of FIG. 5A or FIG. 5B.

FIG. 11 is a diagram of an example of a payload format for communication between the main dimmer 502 and the remote dimmer 504, 514. A packet 1100 may comprise two frames. The first frame may comprise a frame number 1102 and event data 1104. The second frame may comprise a frame number 1106, event type 1108, device address 1110, and an error detection 1112. The frame number field 1102 and the frame number field 1106 may identify which frame of the packet 1100 is being sent. The frame number 1102 and the frame number 1106 may comprise one bit each. The event data 1104 may comprise the data being communicated between the main dimmer and the remote dimmer. The event data 1104 may comprise fifteen bits. The event type 1108 may indicate the type of packet 1100 communicated via the AD line 509. For example, the event type 1108 may encode the possible packet types that will be communication via the AD line 509. The event type 1108 may comprise seven bits. The device address 1110 may identify the source device of the packet 1100. The device address 1110 may comprise three bits. The error detection field 1112 may encode the forward error detection result to be used by the receiving device to validate the packet 1100. For example, the error detection field 1112 may comprise a multi-bit cyclic redundancy check (CRC) (e.g., a five bit CRC) that may be used by the receiving device to validate the packet 1100.

Figure 12:
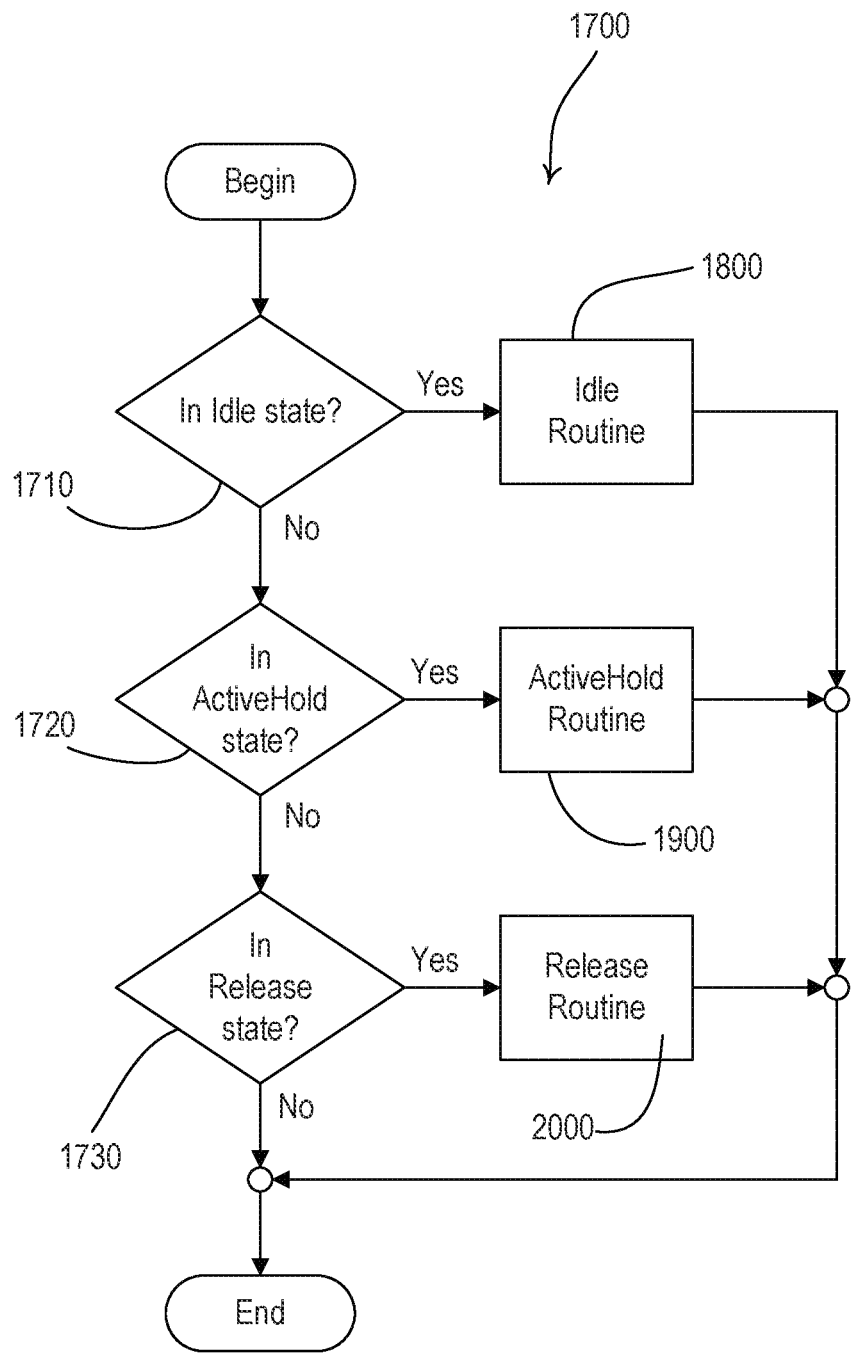
FIG. 12 is a flowchart of an example of a user interface procedure executed by the control circuit of the main load control device of FIG. 7.

FIG. 12 is a flowchart of an example of a user interface procedure 1700 executed periodically by the control circuit 714 of the main dimmer 502, e.g., once every 10 msec. The user interface procedure 1700 may selectively execute one of three routines depending upon the state of the main dimmer 502. If the main dimmer 502 is in an "Idle" state (i.e., the user is not actuating the touch sensitive actuator 610) at step 1710, the control circuit 714 may execute an Idle routine 1800. If the main dimmer 502 is in an "ActiveHold" state (i.e., the user is presently actuating the touch sensitive actuator 610) at step 1720, the control circuit 714 may execute an ActiveHold routine 1900. If the main dimmer 502 is in a "Release" state (i.e., the user has recently ceased actuating the touch sensitive actuator 610) at step 1730, the control circuit 714 may execute a Release routine 2000.

Figure 13:
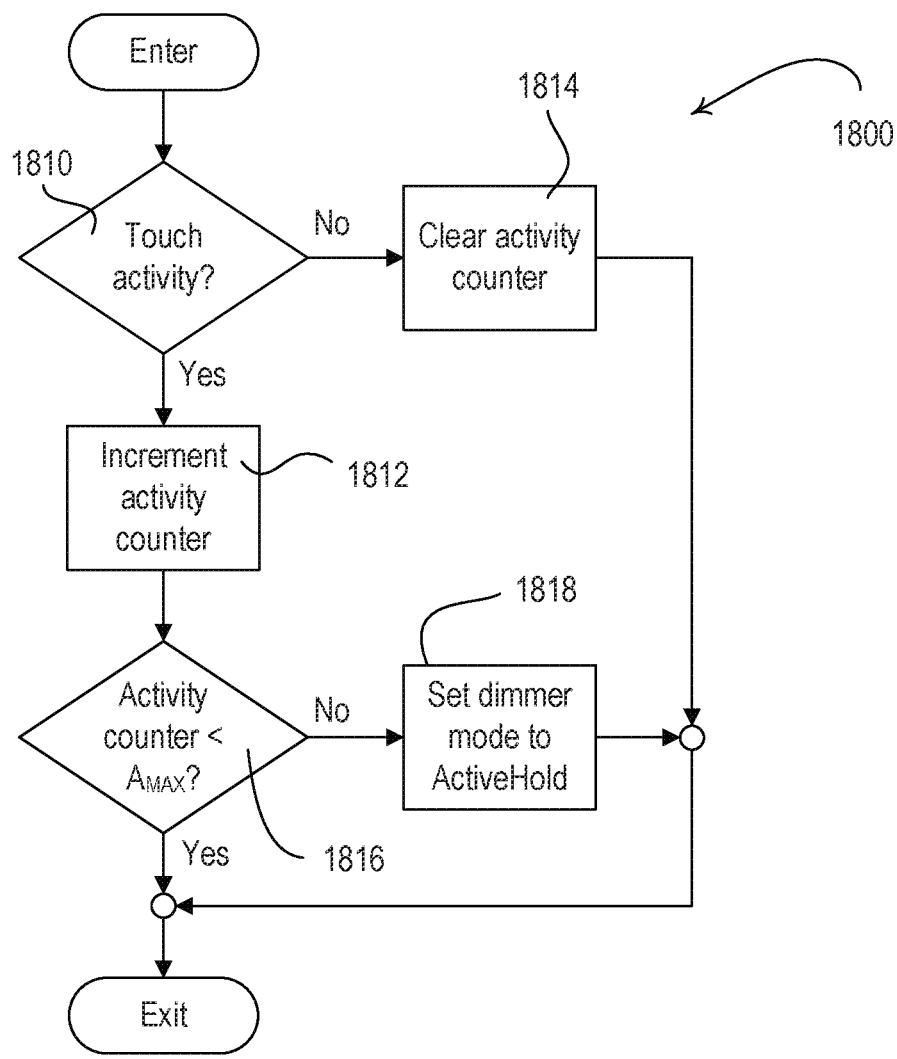
FIG. 13 is a flowchart of an example of an Idle routine of the user interface procedure of FIG. 12.

FIG. 13 is a flowchart of an example of the Idle routine 1800, which may be executed periodically when the main dimmer 502 is in the Idle state. The control circuit 714 may change the state of the main dimmer 502 to the ActiveHold state when the user actuates the touch sensitive actuator 610. For example, if there is activity on the touch sensitive actuator 610 of the main dimmer 502 at step 1810, an activity counter may be incremented at step 1812. Otherwise, the activity counter may be cleared at step 1814. The activity counter may be used by the control circuit 714 to ensure that the main dimmer 502 changes to the ActiveHold state (e.g., only changes to the ActiveHold state) in response to an actuation of the touch sensitive actuator 610 and not as a result of noise or some other undesired impulse. The use of the activity counter may be similar to a software "debouncing" procedure for a mechanical switch. If the activity counter is not less than a maximum activity counter value AMAX at step 1816, then the state of the main dimmer 502 is set to the ActiveHold state at step 1818. Otherwise, the Idle routine 1800 may exit.

Figure 14:
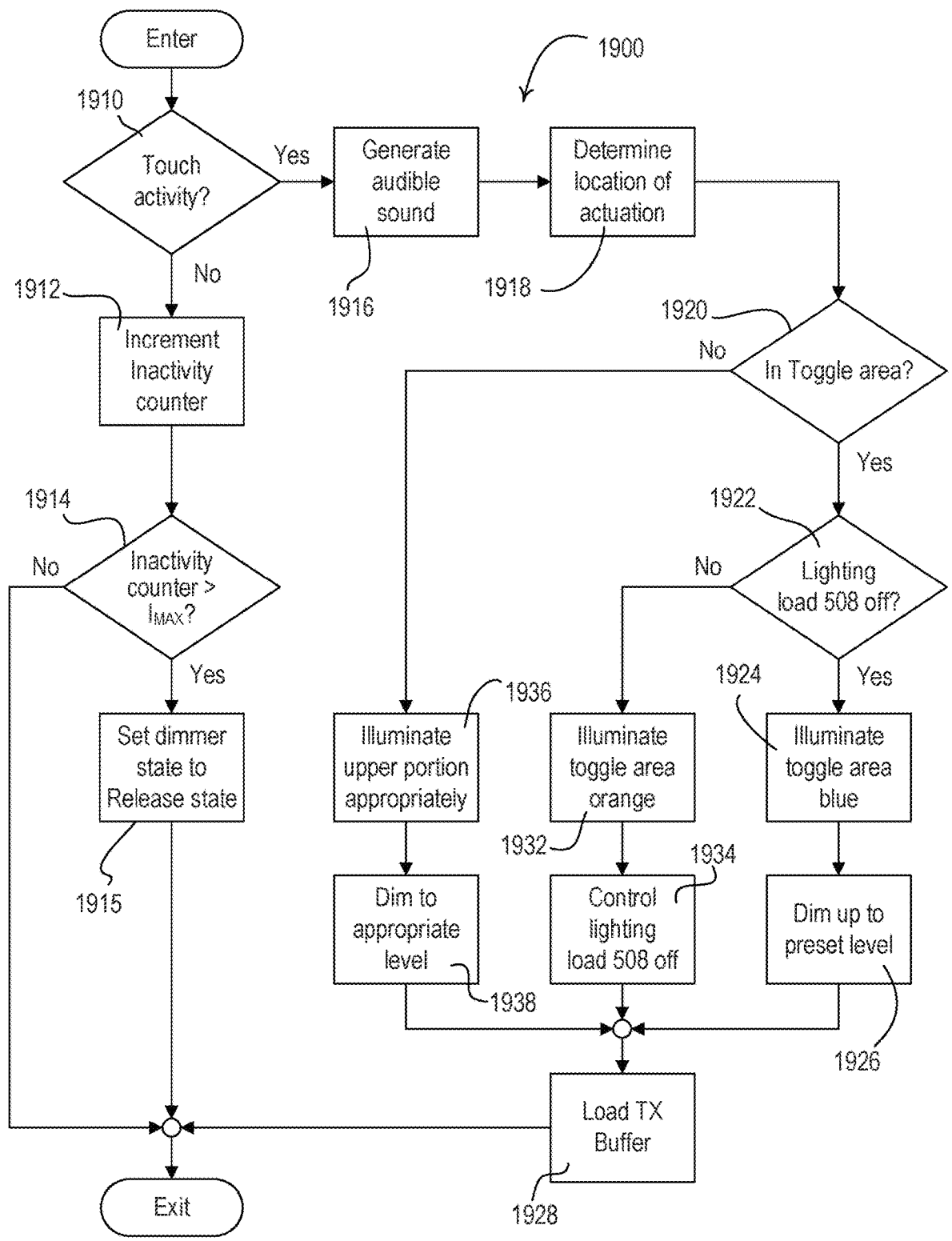
FIG. 14 is a flowchart of an example of an ActiveHold routine of the user interface procedure of FIG. 12.

FIG. 14 is a flowchart of an example of the ActiveHold routine 1900, which may be executed once every half-cycle when the touch sensitive actuator 610 is being actuated, i.e., when the main dimmer 502 is in the ActiveHold state. The control circuit 714 may make a determination as to whether the user has stopped using, i.e., released, the touch sensitive actuator 610. If there is no activity on the touch sensitive actuator 610 at step 1910, the control circuit 714 may increment an "inactivity counter" at step 1912. The control circuit 714 may use the inactivity counter to make sure that the user is not still actuating the touch sensitive actuator 610 before entering the Release mode. If the inactivity counter is less than a maximum inactivity counter value IMAX at step 1914, the ActiveHold routine 1900 may exit. Otherwise, the state of the main dimmer 502 may be set to the Release state at step 1915, and the routine 1900 may exit.

If there is activity on the touch sensitive actuator 610 at step 1910, the control circuit 714 may generate an audible sound at step 1916 using the audible sound generator 718. An example of the generation of the audible sound is described in greater detail in commonly-assigned U.S. Pat. No. 7,608,948, issued Oct. 27, 2009, entitled TOUCH SCREEN WITH SENSORY FEEDBACK, the entire disclosure of which is hereby incorporated by reference. The control circuit 714 may determine where along the length of the actuation member 612 that the touch sensitive actuator is being actuated at step 1918. If the touch sensitive actuator 610 is being actuated in the toggle area, i.e., the lower portion 612B of the actuation member 612, at step 1920, the control circuit 714 may process the actuation of the touch sensitive actuator as a toggle. If the lighting load 508 is presently off at step 1922, the control circuit 714 may turn the lighting load on. For example, the control circuit 714 may illuminate the lower portion 612B of the actuation member 612 white at step 1924 and dim the lighting load 508 up to the preset level, i.e., the desired lighting intensity of the lighting load, at step 1926. Further, the control circuit 714 may load a digital message into the TX buffer at step 1928. The message description of the digital message may comprise, for example, a light level command and the message data comprises the preset level.

If the lighting load is presently on at step 1922, the control circuit 714 illuminates the lower portion 612B of the actuation member 612 orange at step 1932 and controls the lighting load 508 to off at step 1934. At step 1928, the control circuit 714 loads a digital message into the TX buffer, where the message description is a light level command and the message data comprises zero percent (or off).

If the touch sensitive actuator 610 is not being actuated in the toggle area at step 1920, the upper portion 612A is being actuated and the location of the actuation on the touch sensitive actuator 610 is representative of the desired intensity level of the lighting load 508. At step 1936, the control circuit 714 may illuminate the upper portion 612A of the actuation member 612 appropriately, i.e., as a bar graph representative of the present intensity of the lighting load 508. The control circuit 714 may dim the lighting load 508 to the appropriate level as determined from the location of the actuation of the touch sensitive actuator 610 at step 1938. At step 1928, the control circuit 714 loads the TX buffer with a digital message having a light level command as the message description and the present intensity level as the message data.

Figure 15:
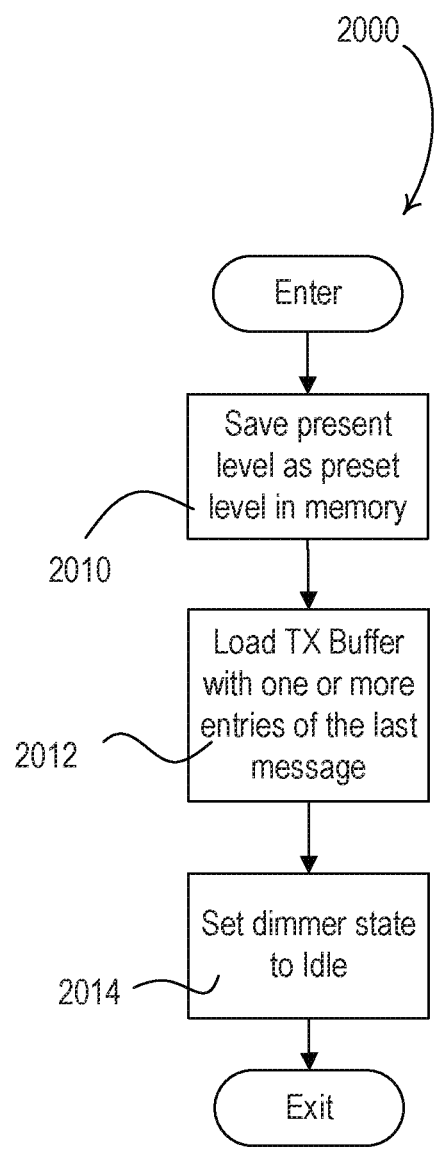
FIG. 15 is a flowchart of an example of a Release routine of the user interface procedure of FIG. 12.

FIG. 15 is a flowchart of an example of the Release routine 2000, which may be executed after the control circuit 714 sets the state of the dimmer state to the Release state at step 1915 of the ActiveHold routine 1900. The control circuit 714 may store the present intensity level of the lighting load 508 in the memory 718 at step 2010. At step 2012, the control circuit 714 may store one or more entries of the last digital message to be transmitted in response to the actuation of the touch sensitive actuator 610 into the TX buffer, for example, such that the main dimmer 502 may send one or more identical digital messages to the remote dimmers 504 to ensure that the remote dimmers received the digital message. The control circuit 714 may set the state of the main dimmer 502 to the Idle state at step 2014, and the Release routine 2000 may exit.

The message description of the digital messages transmitted between the main dimmer 502 and the remote dimmers 504 may comprise an advanced programming mode (APM) command, i.e., a command to adjust an advanced programming feature, such as a protected preset, a fade rate, and/or the like. If an advanced programming mode feature is modified at the main dimmer 502, the main dimmer 502 may transmit to the remote dimmers 504 a digital message having the message description containing the APM command and the message data comprising the APM feature to change and the value to change the APM feature to. For example, the digital message may be transmitted one or more times during the Release routine 2000. An example of an advanced programming mode is described in greater detail in commonly-assigned U.S. Pat. No. 7,190,125, issued Mar. 13, 2007, entitled PROGRAMMABLE WALLBOX DIMMER, the entire disclosure of which is hereby incorporated by reference.

Figure 16:
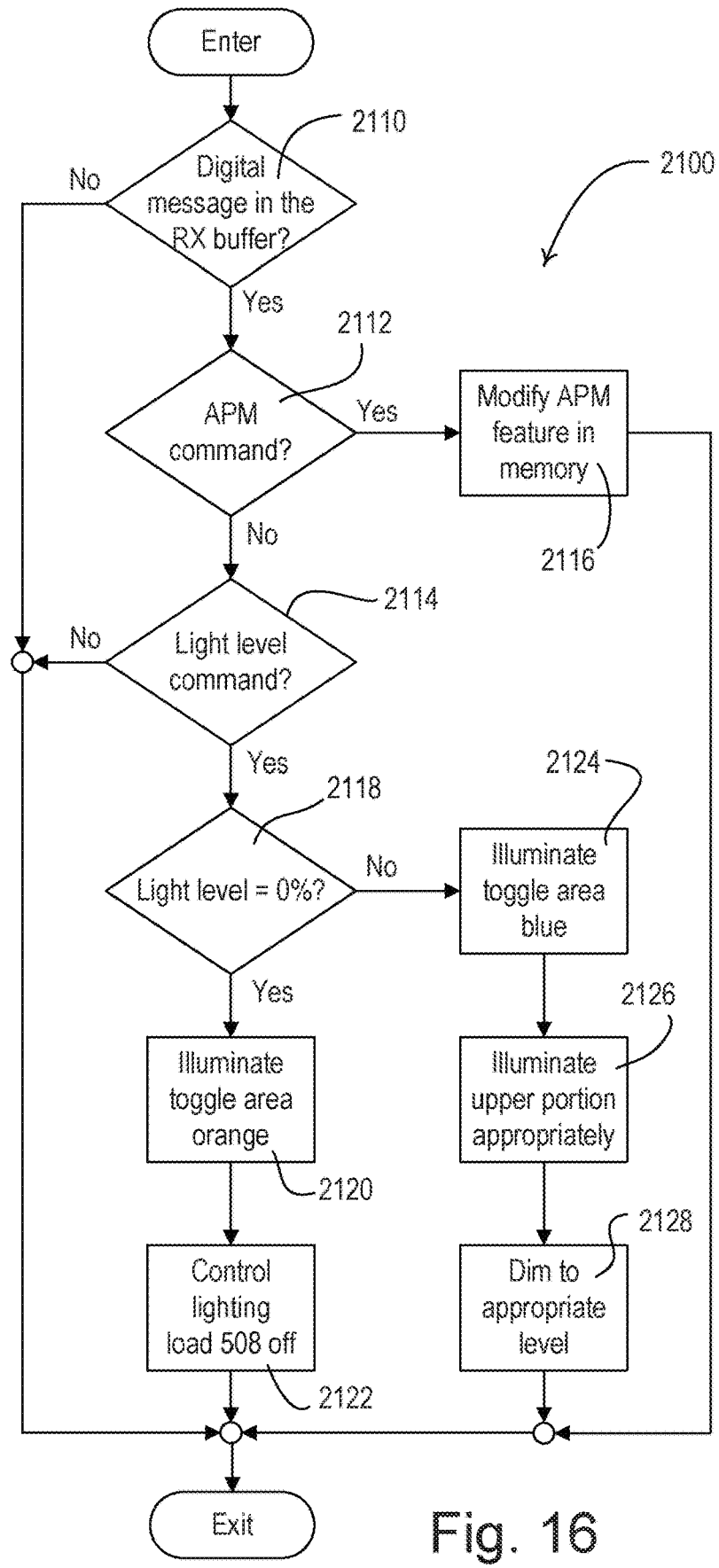
FIG. 16 is a flowchart of an example of a RX buffer procedure executed by the control circuit of the main load control device of FIG. 7.

FIG. 16 is a flowchart of an example of a RX buffer procedure 2100 executed periodically by the control circuit 714 of the main dimmer 502, e.g., once every positive or negative half-cycle. If there is a digital message in the RX buffer at step 2110, the control circuit 714 may determine whether the message description of the digital message contains an APM command at step 2112 or a light level command at step 2114. If the message description is an APM command at step 2112, the APM feature is modified in the memory 718 at step 2116 and the procedure 2100 exits. If the message description is a light level command at step 2116 and the message data of the digital message is zero percent (i.e., off) at step 2118, the control circuit 714 may illuminate the toggle area (i.e., the lower portion 612B of the actuation member 612) at step 2120, and/or may control the lighting load 508 to off at step 2122. On the other hand, if the message data for the light level command is an intensity greater than zero percent at step 2118, the control circuit 714 may illuminate the toggle area white at step 2124, and/or may illuminate the upper portion 612A of the actuation member 612 appropriately (i.e., as a bar graph representative of the present intensity of the lighting load 508) at step 2126. The control circuit 714 may control the intensity of the lighting load 508 to the appropriate level as determined from the message data of the digital message at step 2128 and the procedure 2100 may exit.

Figure 17:
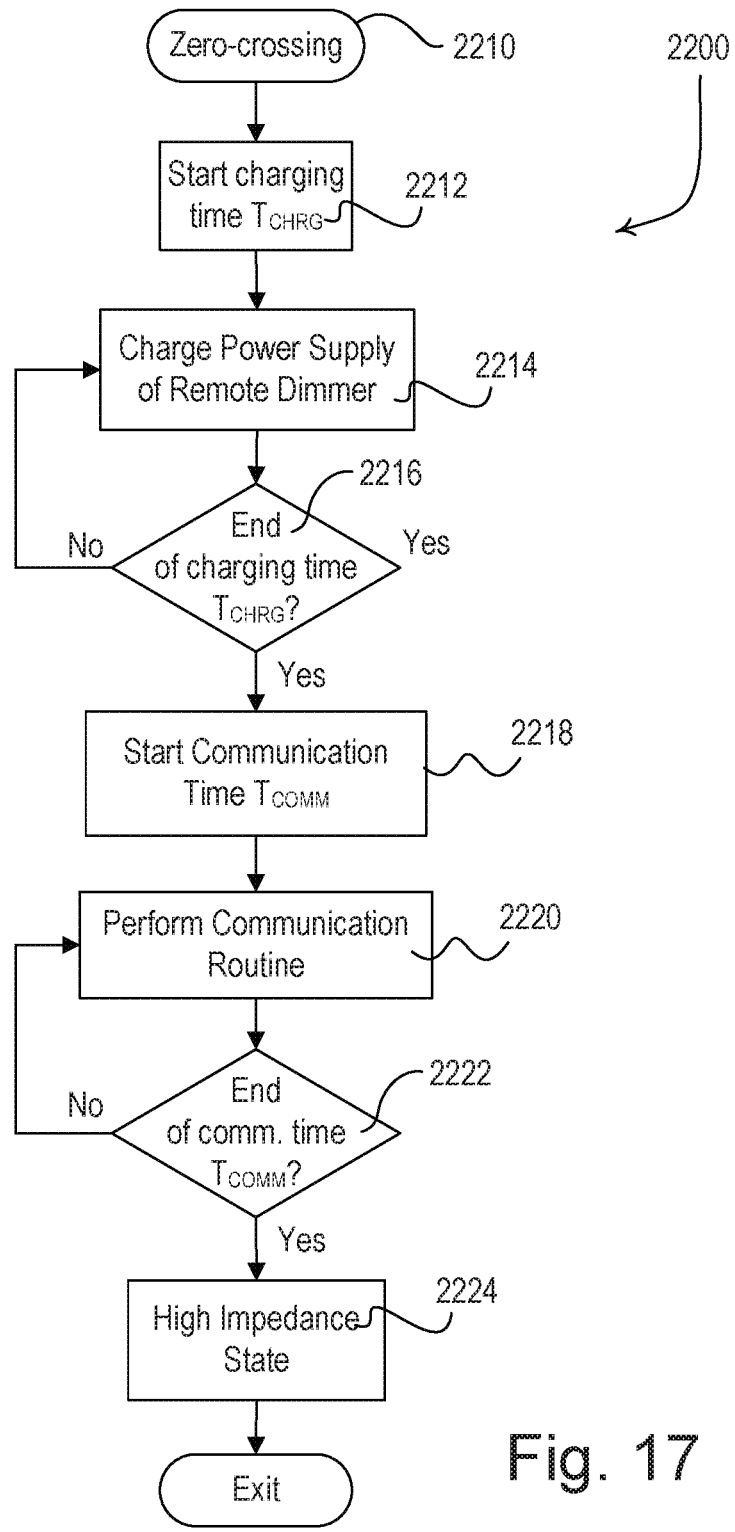
FIG. 17 is a flowchart of an example of a multi-location control procedure executed by the control circuit of the main load control device of FIG. 7.

FIG. 17 is a flowchart of an example of a multi-location control procedure 2200 executed by the control circuit 714 of the main dimmers 502. The multi-location control procedure 2200 may be executed periodically, e.g., once every line cycle. The procedure 2200 may begin at step 2210 when the zero-crossing detector 716 signals a zero-crossing to the control circuit 714 (e.g., at the beginning of the charging time $T_{CHRG}$ as shown in FIG. 10). Upon receiving the zero-crossing signal, the control circuit 714 may start the charging time $T_{CHRG}$ at step 2212. During the charging time $T_{CHRG}$ at 2214, the main dimmer 502 may charge the power supply 830 of the remote dimmer 504. For example, the control circuit 714 may render the transistors Q906 and Q908 conductive to charge the capacitor 940 of the remote dimmer 504.

At 2216, the control circuit 714 may determine if the charging time $T_{CHRG}$ has ended. If not, then the control circuit 714 may continue to charge the power supply 830 of the remote dimmer 504. If the charging time $T_{CHRG}$ has ended, the control circuit 714 may start a communication time $T_{COMM}$ at 2218.

During the communication time $T_{COMM}$, the control circuit 714 may perform a communication routine at 2220. For example, the control circuit 714 may transmit a digital message to the remote dimmer 504 and/or receive a digital message from the remote dimmer 504 via control of the AD line 509 by the sender (i.e., placing the AD line 509 in the active pull-up state and/or the active-pull down state). To transmit a digital message, the control circuit 714 may render the transistor Q906 conductive. Then, to place the AD line 509 in the active pull up state to communicate a "1" bit, the control circuit 714 may render the transistor Q908 conductive and the transistor Q912 non-conductive. To place the AD line 509 in the active pull down state to communicate a "0" bit, the control circuit 714 may render the transistor Q908 non-conductive and the transistor Q912 conductive. Therefore, the control circuit 714 may inversely control the transistors Q908 and Q912 in a complementary manner to communicate a "1" bit or a "0" bit. To receive a digital message from the remote dimmer 504 during the communication time $T_{COMM}$, the control circuit 714 of the main dimmer 502 may render the transistor Q910 conductive. During the communication time $T_{COMM}$, the control circuit 714 may render the transistor 910 conductive, such that the control circuit 714 is able to receive a digital message from the remote dimmer 504.

At 2222, the control circuit 714 may determine if the communication time $T_{COMM}$ has ended. If not, the control circuit 714 may continue to perform the communication routine. If the communication time $T_{COMM}$ has ended, the control circuit 714 my place the AD line 509 in a high impedance state at 2224, for example, until the next charging time period $T_{CHRG}$. For example, the control circuit 714 may render the transistor Q906 conductive and the transistors Q908, Q910, and Q912 non-conductive to place the AD line 509 in a high impedance state.

Figure 18:
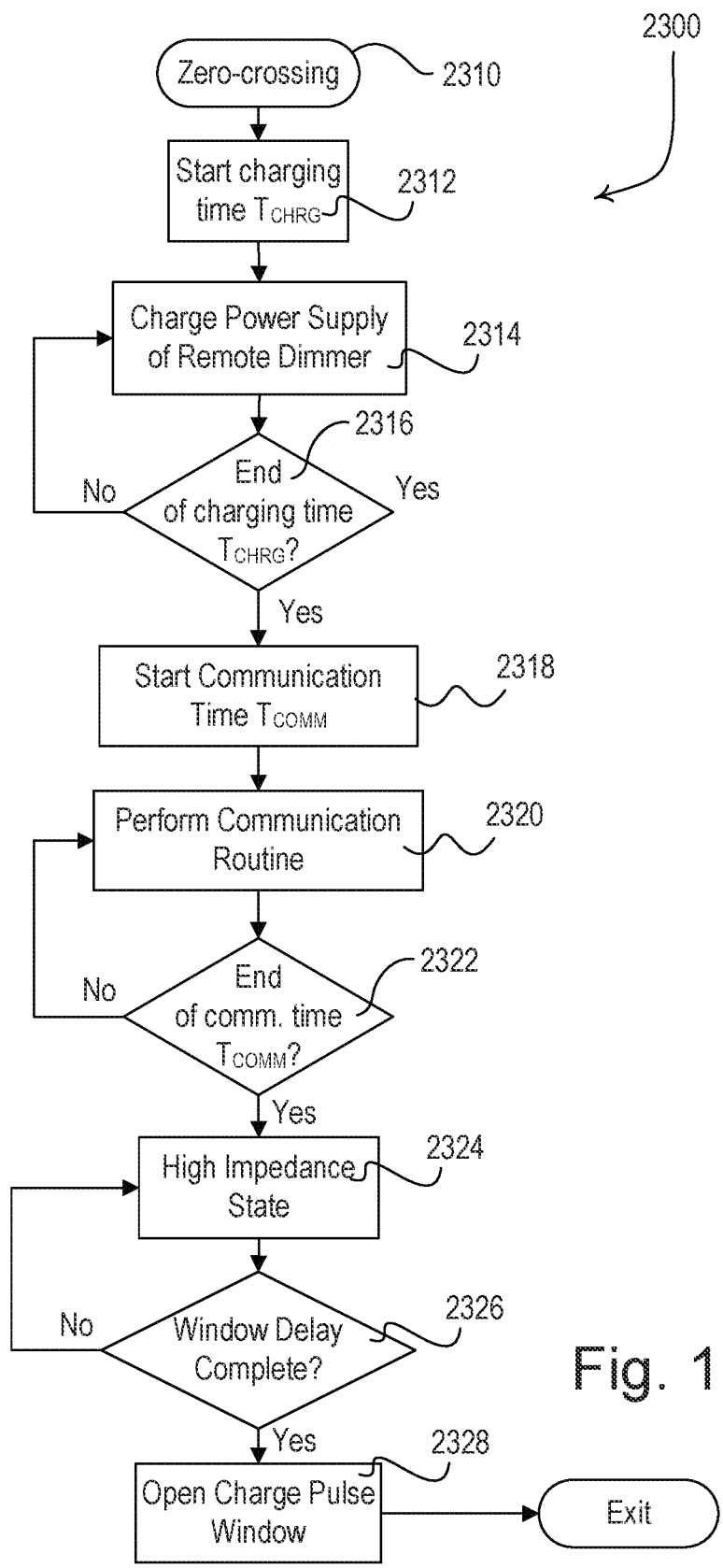
FIG. 18 is a flowchart of an example of a multi-location control procedure executed by the control circuit of the remote load control device of FIG. 8A or FIG. 8B.

FIG. 18 is a flowchart of an example of a multi-location control procedure 2300 executed by the control circuit 814 of the remote dimmers 504, 514. The multi-location control procedure 2300 may be executed periodically, e.g., once every line cycle. The procedure 2300 may begin at step 2310 when the zero-crossing detector 816 signals a zero-crossing to the control circuit 814 (e.g., at the beginning of the charging time $T_{CHRG}$ as shown in FIG. 10). Upon receiving the zero-crossing signal, the control circuit 814 may start the charging time $T_{CHRG}$ at step 2312. During the charging time $T_{CHRG}$ at 2314, the power supply 830 of the remote dimmer 504 may be charged by the main dimmer 502. For example, during the charging time $T_{CHRG}$, the control circuit 814 may render the transistors Q930, Q932, and Q934 non-conductive so that the capacitor 830 of the remote dimmer 504 may be charged.

At 2316, the control circuit 814 may determine if the charging time $T_{CHRG}$ has ended. If not, then the control circuit 814 may continue to render the transistors Q930, Q932, and Q934 non-conductive so that the power supply 830 may be charged. If the charging time $T_{CHRG}$ has ended, the control circuit 814 may start a communication time $T_{COMM}$ at 2318.

During the communication time $T_{COMM}$, the control circuit 814 may perform a communication routine at 2320. For example, the control circuit 814 may transmit a digital message to the main dimmer 502 and/or receive a digital message from the main dimmer 502 via control of the AD line 509 by the sender (i.e., placing the AD line 509 in the active pull-up state and/or the active-pull down state). To receive a digital message, the control circuit 814 may render the transistor Q932 conductive. To transmit a digital message, the control circuit 814 may render the transistor Q934 conductive. Then, to place the AD line 509 in the active pull up state to communicate a "1" bit, the control circuit 814 may render the transistor Q934 conductive and the transistor Q930 non-conductive. To place the AD line 509 in the active pull down state to communicate a "0" bit, the control circuit 814 may render the transistor Q934 non-conductive and the transistor Q930 conductive. Therefore, the control circuit 814 of the remote dimmer 504 may inversely control the transistors Q934 and Q930 in a complementary manner to communicate a "1" bit or a "0" bit. During the communication time $T_{COMM}$, the control circuit 814 may render the transistor 932 conductive, such that the control circuit 814 is able to receive a digital message from the main dimmer 502.

At 2322, the control circuit 814 may determine if the communication time $T_{COMM}$ has ended. If not, the control circuit 814 may continue to perform the communication routine. If the communication time $T_{COMM}$ has ended, the control circuit 814 my place the AD line 509 in a high impedance state at 2324, for example, until the next charging time period $T_{CHRG}$. For example, the control circuit 814 may render the transistors Q930, Q932, and Q934 non-conductive to place the AD line 509 in a high impedance state.

At 2326, the control circuit 814 may determine if the window delay period TDELAY is complete. If the delay period TDELAY is complete, then the control circuit 814 may open the charge pulse window $T_{CPW}$ at 2328. During the charge pulse window $T_{CPW}$, the control circuit 814 may monitor for a charge pulse that may occur during a subsequent charging time period $T_{CHRG}$ during a subsequent line cycle. The detection of the charge pulse during the charge pulse window $T_{CPW}$ may be used by the control circuit 814 to stay in synchronization with the main dimmer 502. For example, the rising edge of the charge pulse during the charging time period $T_{CHRG}$ may be detected by the zero-cross detector 816 to establish the timing for the rest of the line cycle. As such, the control circuit 814 may start a subsequent charging time $T_{CHRG}$, e.g., return to 2312, upon detecting the charge pulse.

Since the digital messages transmitted between the main dimmers 502 and the remote dimmers 504 may include APM commands, the APM features of the load control system 500/510 may be modified using the user interface 600 of the main dimmer 502 and/or a remote dimmer 504. The main dimmer 502 and the remote dimmers 504 may be used to adjust local advanced programming features (i.e., of the main dimmer 502) and global advanced programming features (i.e., affecting the main dimmer 502 and one or more of the remote dimmers 504).

Although described with reference to a main dimmer and a remote dimmer, one or more embodiments described herein may be used with other load control devices. For example, one or more of the embodiments described herein may be performed by a variety of load control devices that are configured to control of a variety of electrical load types, such as, for example, a LED driver for driving an LED light source (e.g., an LED light engine); a screw-in luminaire including a dimmer circuit and an incandescent or halogen lamp; a screw-in luminaire including a ballast and a compact fluorescent lamp; a screw-in luminaire including an LED driver and an LED light source; a dimming circuit for controlling the intensity of an incandescent lamp, a halogen lamp, an electronic low-voltage lighting load, a magnetic low-voltage lighting load, or another type of lighting load; an electronic switch, controllable circuit breaker, or other switching device for turning electrical loads or appliances on and off; a plug-in load control device, controllable electrical receptacle, or controllable power strip for controlling one or more plug-in electrical loads (e.g., coffee pots, space heaters, other home appliances, and the like); a motor control unit for controlling a motor load (e.g., a ceiling fan or an exhaust fan); a drive unit for controlling a motorized window treatment or a projection screen; motorized interior or exterior shutters; a thermostat for a heating and/or cooling system; a temperature control device for controlling a heating, ventilation, and air conditioning (HVAC) system; an air conditioner; a compressor; an electric baseboard heater controller; a controllable damper; a humidity control unit; a dehumidifier; a water heater; a pool pump; a refrigerator; a freezer; a television or computer monitor; a power supply; an audio system or amplifier; a generator; an electric charger, such as an electric vehicle charger; and an alternative energy controller (e.g., a solar, wind, or thermal energy controller). A single control circuit may be coupled to and/or adapted to control multiple types of electrical loads in a load control system.

What is claimed is:

1. An electric load control device comprising:
    user interface circuitry to receive user input indicative of a target electric load output parameter;
    power input circuitry to receive an alternating current (AC) supply from a controllably conductive device disposed in a remote electric load control device;
    accessory dimmer (AD) communication interface circuitry to bidirectionally exchange information with the remote electric load control device; and
    control circuitry to:
        receive, from operatively coupled zero detect circuitry, a first input indicative of a zero crossing of the AC supply;
        cause operatively coupled power supply circuitry to charge using the received AC supply for a first portion of an AC half cycle responsive to receipt of the first input;
        receive, via the user interface circuitry, the user input indicative of a first target electric load output parameter value for an electric load device operatively coupled to the controllably conductive device;
        responsive to receipt of the user input, generate a first message that includes data representative of the first target electric load output parameter value;
        provide a buffer period for a second portion of the AC half cycle after passage of the first portion of the AC half cycle; and
        cause a transmission, via the AD communication interface circuitry, of the generated first message during a third portion of the AC half cycle after the passage of the second portion of the AC half cycle.

2. The electric load control device of claim 1:
    wherein the user interface further comprises a display device; and
    wherein the control circuitry to further:
        cause the display device to generate an output indicative of the received first target electric load output parameter responsive to receipt of the user input.

3. The electric load control device of claim 2 wherein the control circuitry to further:
    receive, via the AD communication interface circuitry, a second message that includes data representative of a second target electric load output parameter value; and
    cause the display device to generate an output indicative of the received second target electric load output parameter value responsive to receipt of the second message.

4. The electric load control device of claim 1 wherein the control circuitry to further:
    monitor for a charge pulse window during a portion of the AC cycle prior to transition of the AC supply from a negative half cycle to a positive half cycle.

5. The electric load control device of claim 1 wherein the control circuitry to further, responsive to a placement of the controllably conductive device on the line side of the electric load device:
    charge the power supply for the first portion of a positive half cycle;
    provide the buffer period for the second portion of the positive half cycle; and
    cause the transmission, via the AD communication interface circuitry, of the generated first message during the third portion of the positive half cycle.

6. The electric load control device of claim 1 wherein the control circuitry to further, responsive to a placement of the controllably conductive device on the load side of the electric load device:
    charge the power supply for the first portion of a negative half cycle;
    provide the buffer period for the second portion of the negative half cycle; and
    cause the transmission, via the AD communication interface circuitry, of the generated first message during the third portion of the negative half cycle.

7. An electric load control method, comprising:
    receiving, by control circuitry, a first input indicative of a zero crossing of the AC supply from operatively coupled zero detect circuitry;
    causing, by the control circuitry, operatively coupled power supply circuitry to charge using an alternating current (AC) supply for a first portion of a half cycle of the AC supply responsive to receipt of the first input;
    receiving, by the control circuitry, a user input indicative of a first target electric load output parameter value for an electric load device operatively coupled to a controllably conductive device disposed in a remote electric load controller;
    generating, by the control circuitry, a first message that includes data representative of the first target electric load output parameter value responsive to receipt of the user input;
    providing, by the control circuitry, a buffer period for a second portion of the half cycle of the AC supply after passage of the first portion of the half cycle of the AC supply; and
    causing, by the control circuitry, a transmission of the generated first message during a third portion of the half cycle of the AC supply after passage of the second portion of the half cycle of the AC supply via the AD communication interface circuitry.

8. The method of claim 7, further comprising:
    causing, by the control circuitry, a generation of a user-perceptible output indicative of the received first target electric load output parameter responsive to receipt of the user input.

9. The method of claim 8, further comprising:
    receiving, by the control circuitry, a second message that includes data representative of a second target electric load output parameter value; and
    causing, by the control circuitry, a generation of a user-perceptible output indicative of the received second target electric load output parameter value responsive to receipt of the second message.

10. The method of claim 7, further comprising:
    monitoring, by the control circuitry, for a charge pulse window during a portion of the AC cycle immediately prior to a transition of the AC supply from a negative half cycle to a positive half cycle.

11. The method of claim 7, further comprising, responsive to a placement of the controllably conductive device on the line side of the electric load device:
    causing, by the control circuitry, operatively coupled power supply circuitry to charge using the AC supply for a first portion of a positive half cycle of the AC supply;
    providing, by the control circuitry, the buffer period for the second portion of the positive half cycle of the AC supply and causing, by the control circuitry, the transmission of the generated first message during the third portion of the positive half cycle of the AC supply.

12. The method of claim 7, further comprising, responsive to a placement of the controllably conductive device on the line side of the electric load device:
   causing, by the control circuitry, operatively coupled power supply circuitry to charge using the AC supply for a first portion of a negative half cycle of the AC supply;
   providing, by the control circuitry, the buffer period for the second portion of the negative half cycle of the AC supply; and
   causing, by the control circuitry, the transmission of the generated first message during the third portion of the negative half cycle of the AC supply.

13. A non-transitory, machine-readable, storage device that includes instructions that, when executed by an electric load controller, cause the electric load controller to:
   receive a first input indicative of a zero crossing of the AC supply from operatively coupled zero detect circuitry;
   cause operatively coupled power supply circuitry to charge using an alternating current (AC) supply for a first portion of a half cycle of the AC supply responsive to receipt of the first input;
   receive a user input indicative of a first target electric load output parameter value for an electric load device operatively coupled to an controllably conductive device disposed in a remote electric load controller;
   generate a first message that includes data representative of the first target electric load output parameter value responsive to receipt of the user input;
   provide a buffer period for a second portion of the half cycle of the AC supply after passage of the first portion of the half cycle of the AC supply; and
   cause a transmission of the generated first message during a third portion of the half cycle of the AC supply after passage of the second portion of the half cycle of the AC supply via the AD communication interface circuitry.

14. The non-transitory, machine-readable, storage device of claim 13 wherein the instructions, when executed by the electric load controller, cause the electric load controller to:
   cause a generation of a user-perceptible output indicative of the received first target electric load output parameter responsive to receipt of the user input.

15. The non-transitory, machine-readable, storage device of claim 14 wherein the instructions, when executed by the electric load controller, cause the electric load controller to:
   receive a second message that includes data representative of a second target electric load output parameter value; and
   cause a generation of a user-perceptible output indicative of the received second target electric load output parameter value responsive to receipt of the second message.

16. The non-transitory, machine-readable, storage device of claim 13 wherein the instructions, when executed by the electric load controller, cause the electric load controller to:
   monitor for a charge pulse window during a portion of the AC cycle immediately prior to a transition of the AC supply from a negative half cycle to a positive half cycle.

17. The non-transitory, machine-readable, storage device of claim 13 wherein the instructions, when executed by the electric load controller, cause the electric load controller to, responsive to a placement of the controllably conductive device on the line side of the electric load device:
   cause the operatively coupled power supply circuitry to charge using the AC supply for a first portion of a positive half cycle of the AC supply;
   provide the buffer period for the second portion of the positive half cycle of the AC supply and
   cause the transmission of the generated first message during the third portion of the positive half cycle of the AC supply.

18. The non-transitory, machine-readable, storage device of claim 13 wherein the instructions, when executed by the electric load controller, cause the electric load controller to, responsive to a placement of the controllably conductive device on the line side of the electric load device:
   cause the operatively coupled power supply circuitry to charge using the AC supply for a first portion of a negative half cycle of the AC supply;
   provide the buffer period for the second portion of the negative half cycle of the AC supply; and
   cause the transmission of the generated first message during the third portion of the negative half cycle of the AC supply.

* * * * *